US005969981A

United States Patent [19]

Kono

[11] Patent Number: 5,969,981

[45] Date of Patent: Oct. 19, 1999

[54] SEMICONDUCTOR MEMORY DEVICE EMPLOYING FERROELECTRIC MEMORY CELL, ATTAINING LOW POWER CONSUMPTION WHILE PREVENTING DETERIORATION OF FERROELECTRIC

[75] Inventor: Takashi Kono, Hyogo, Japan

[73] Assignee: Mitsubishi Denki Kabushiki Kaisha, Tokyo, Japan

[21] Appl. No.: 09/061,051

[22] Filed: Apr. 16, 1998

[30] Foreign Application Priority Data

Nov. 12, 1997 [JP] Japan .................................... 9-310823

[51] Int. Cl.[6] ........................................................ G11C 7/00

[52] U.S. Cl. ............................................ 365/145; 365/222

[58] Field of Search .................................... 365/145, 222, 365/149

[56] References Cited

FOREIGN PATENT DOCUMENTS 7-244988 9/1995 Japan .

OTHER PUBLICATIONS

"Half–Vcc Plate Nonvolatile DRAMs with Ferroelectric Capacitors", K. Takeuchi et al., IEICE Trans. Electron., vol. E79–C, No. 2, Feb. 1996, pp. 234–242.

*Primary Examiner*—Vu A. Le

*Attorney, Agent, or Firm*—McDermott, Will & Emery

[57] ABSTRACT

A memory cell array of a semiconductor memory device is split into memory blocks. A DRAM/nonvolatile mode switching circuit makes each memory cell operate similarly to a DRAM when each memory block is accessed from the exterior while making each memory cell operate as a nonvolatile memory cell to require no refreshment when each memory block is not accessed for a constant period. An internal timer circuit manages a waiting time for the memory block shifting to a nonvolatile mode after entering a non-accessed state. Thus, the semiconductor memory device can attain stable power consumption reduction hardly influenced by a user state.

16 Claims, 31 Drawing Sheets

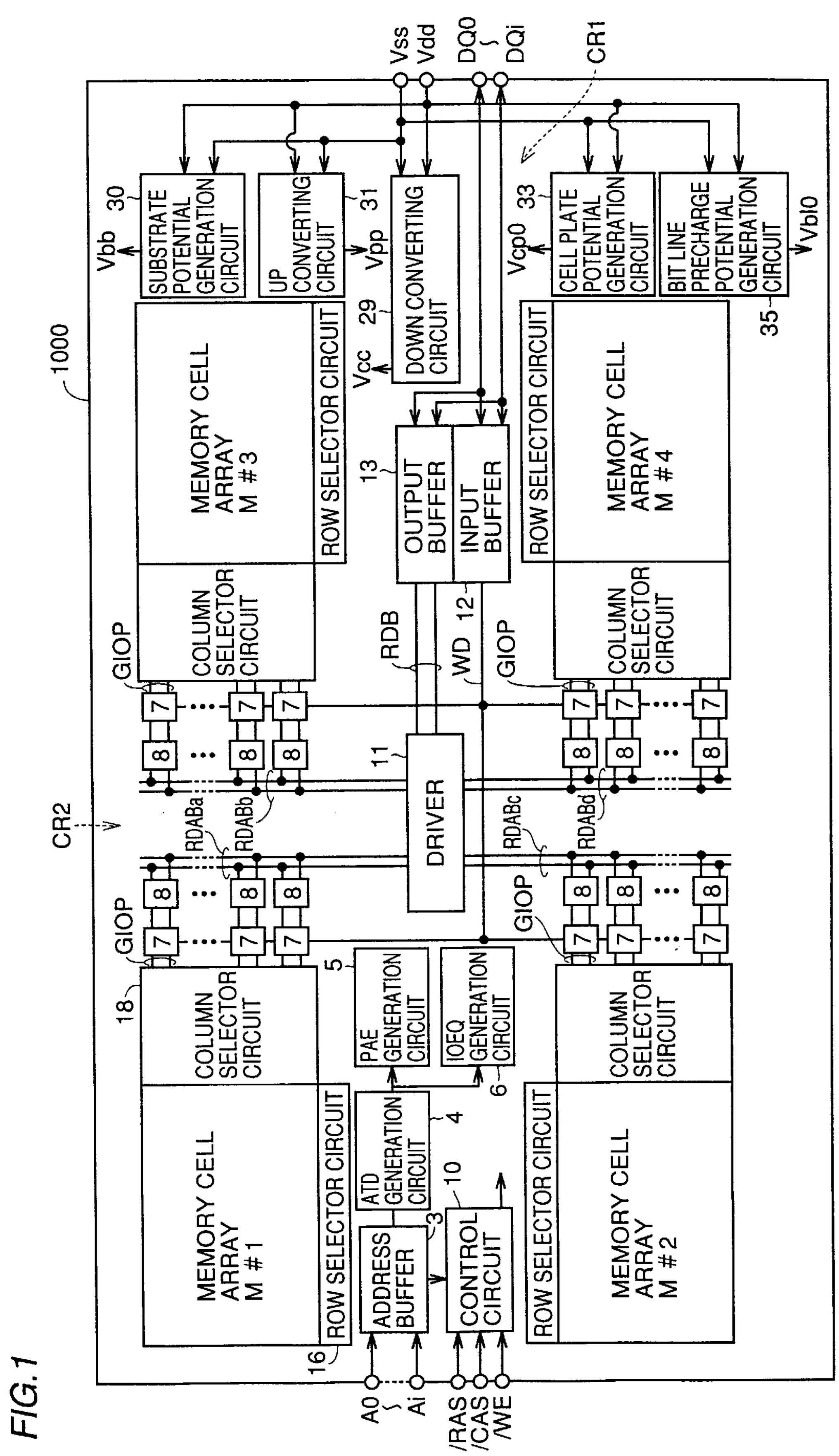
FIG.1
1000
CR1
CR2
Vss
Vdd
DQ0
DQi
A0
Ai
/RAS
/CAS
/WE
SUBSTRATE POTENTIAL GENERATION CIRCUIT
30
Vbb
UP CONVERTING CIRCUIT
31
Vpp
DOWN CONVERTING CIRCUIT
29
Vcc
CELL PLATE POTENTIAL GENERATION CIRCUIT
33
Vcp0
BIT LINE PRECHARGE POTENTIAL GENERATION CIRCUIT
35
Vbl0
MEMORY CELL ARRAY M #3
MEMORY CELL ARRAY M #4
MEMORY CELL ARRAY M #1
MEMORY CELL ARRAY M #2
ROW SELECTOR CIRCUIT
COLUMN SELECTOR CIRCUIT
OUTPUT BUFFER
13
INPUT BUFFER
12
RDB
WD
GIOP
DRIVER
11
RDABa
RDABb
RDABc
RDABd
PAE GENERATION CIRCUIT
5
IOEQ GENERATION CIRCUIT
6
ATD GENERATION CIRCUIT
4
ADDRESS BUFFER
3
CONTROL CIRCUIT
10
16
18
7
8

ADDRESS BUFFER CIRCUIT
3
INTERNAL REFRESH COUNTER CIRCUIT
56
PREDECODER
54
60
BSM
BS
TIMER CIRCUIT
58
MC
DRAM/NONVOLATILE MODE SWITCHING CIRCUIT
62
ZREF
ACTR
RSA0-q
Vcp,Vbl
ROW CONTROL SIGNAL GENERATION CIRCUIT GROUP
64
Xm-n,...
ROW CIRCUIT (ROW DECODER etc.)
52
BLOCK B11

I/O
CSL
SAE
BLEQ
BL1
DCP
DWL1
CPD
DWL0
WL0
CP
WL1
X0
/X0
X1
/X1
/X2
DWD1
DWD0
WD0
WD1
BL
/BL
SENSE AMPLIFIER
BIT LINE EQUALIZER
REFERENCE CELL
MEMORY CELL
Vbl

288
REFS
ZMC
352
354
356
OSCILLATOR
ACTR
358
RVBL
366
368
370
372
CK
T-FF
reset
COUNTER
360
362
364
ORIGIN ADDRESS REGISTER
RSA0-q 1300
POR GENERATION CIRCUIT
172
OSCILLATOR
174
ZPOR
CLK
T-FF
CK
reset
182
184
186
188
492
494
496
498
FREQUENCY DIVISION CIRCUIT
(N STAGES OF T-FFS)
190
192
194
196
198
OUT
MC
178
200
204
202
BSM
180

SEMICONDUCTOR MEMORY DEVICE EMPLOYING FERROELECTRIC MEMORY CELL, ATTAINING LOW POWER CONSUMPTION WHILE PREVENTING DETERIORATION OF FERROELECTRIC

BACKGROUND OF THE INVENTION

1. Field of the Invention

The present invention relates to a semiconductor memory device, and more specifically, it relates to a semiconductor memory device comprising nonvolatile semiconductor memory cells.

2. Description of the Prior Art

Specifications required to semiconductor memories are now in the process of changing following popularization of information apparatuses. In particular, a semiconductor memory mounted on a portable apparatus requires low power consumption.

A dynamic random access memory (hereinafter referred to as a DRAM) is preferably employed in consideration of its memory capacity and the cost therefore, the DRAM cannot hold data if the power is turned off, due to its characteristics.

Therefore, the DRAM must be so periodically refreshed that the same slightly consumes power even in an unused state (standby state).

On the other hand, a nonvolatile memory, which can hold data also in a power-off state, is excellent in a point that the same requires no complicated operation such as a refresh operation for holding the data.

A flash memory or a ferroelectric memory (FRAM) is regarded as a candidate for such a nonvolatile memory. Particularly the ferroelectric memory, which has some advantages in write operating speed and rewrite count compared to the flash memory, is expected as the representative for future nonvolatile memories.

FIG. 35 is a circuit diagram for illustrating a first exemplary cell structure of a conventional ferroelectric memory.

Referring to FIG. 35, a memory cell 552 includes two access transistors 568 and 570 and ferroelectric capacitors 572 and 572 provided in correspondence to the access transistors 568 and 570 respectively.

This structure is the so-called 2Tr-2C structure, and the gates of the two access transistors 568 and 570 are connected with the same word line WL. A first electrode of the ferroelectric capacitor 572 is connected to a bit line BL through the access transistor 568. A first electrode of the ferroelectric capacitor 574 is connected to a bit line /BL through the access transistor 570. Second electrodes of the ferroelectric capacitors 572 and 574 are connected to a cell plate CP.

In this structure, the two ferroelectric capacitors 572 and 574 store 1-bit data as complementary data.

FIG. 36 shows an operating waveform diagram showing an exemplary read operation of the ferroelectric memory cell 552 appearing in FIG. 35 and illustrates polarization curves of the capacitors 572 and 574.

Referring to FIGS. 35 and 36, an equalize signal BLEQ goes high between times t1 and t2, for precharging the pair of bit lines BL and /BL at low levels. At this time, the potential of the cell plate CP is at a low level.

Between times t2 and t3, the equalize signal BLEQ first goes low, and then the potential of the word line WL rises while the potential of the cell plate CP goes high. Consequently, a small potential difference takes place between the pair of bit lines BL and /BL. Between times t3 and t4, a sense amplifier activation signal SAE goes high to activate the sense amplifier 556, which in turn amplifies the small potential difference between the pair of bit lines BL and /BL for reading data to the exterior.

L data is rewritten in either one of the ferroelectric capacitors 572 and 574 for holding the L data.

Between times t4 and t5, the potential of the cell plate CP goes low for causing a sufficient potential difference between the electrodes of the capacitor 572 or 574 connected with the bit line BL or /BL carrying H data, thereby rewriting the H data.

Between times t5 and t6, the sense amplifier activation signal SAE goes low to inactivate the sense amplifier 556 and the equalize signal BLEQ goes high while the pair of bit lines BL and /BL go low together, whereby the electrodes (storage nodes) of the ferroelectric capacitors 572 and 574 opposite to the cell plate CP go low.

Namely, the potential difference between the electrodes of the ferroelectric capacitors 572 and 574 becomes zero, so that the H and L data are stored as the values of the remanent polarization of the ferroelectric capacitors 572 and 574 as shown in the polarization curves.

The memory cell 552 holds these remanent polarization values, which are nonvolatile, until the next write operation is performed, and requires no refresh operation dissimilarly to the DRAM.

Between times t6 and t7, the potential of the word line WL falls to complete the series of read operations. Even if the word line WL is not closed before the sense amplifier activation signal SAE and the equalize signal BLEQ go low and high respectively, no problem arises dissimilarly to the conventional DRAM.

The conventional ferroelectric memory can read data in the aforementioned operation, and is capable of implementing an access time of about 200 ns, although the same is slightly disadvantageous in access due to the driving of the cell plate potential CP.

Under the present circumstances, however, the conventional ferroelectric memory has some significant problems to be solved.

For example, the polarized state of the ferroelectric capacitor 572 or 574 storing the H data goes round the polarization curve and requires an operation of remarkably inverting the polarized state as shown in FIG. 36, leading to fatigue of the ferroelectric film quality.

If the operating time is lengthened, therefore, the remanent polarization value or the like on the polarization curve so remarkably changes that the memory cannot be used as a nonvolatile memory.

Thus, the read/write count is limited.

In relation to this, the ferroelectric memory is generally not in the so-called simple 1Tr-1C structure but in the cell structure for storing 1-bit data in the 2Tr-2C structure shown in FIG. 35, dissimilarly to the DRAM.

While a memory of the 1Tr-1C structure employs a reference cell which is identical in structure to memory cells for generating a reference potential, this cell is remarkably frequently accessed as compared with the remaining memory cells, and hence the characteristics of the ferroelectric film are so quickly deteriorated following fatigue that the reference cell cannot generate the normal reference potential.

In general, therefore, the ferroelectric memory has a larger chip area than a DRAM of the same capacity.

The aforementioned problem is caused since the ferroelectric memory is regularly used in a nonvolatile mode. To this end, there have been proposed some systems of making the ferroelectric memory, which has a sufficiently larger dielectric constant than capacitors employed in the general DRAM, operate similarly to the DRAM thereby preventing the ferroelectric capacitors from characteristic deterioration resulting from inversion of polarization.

In a system proposed by K. Takeuchi et al. in "Half-Vcc Plate Nonvolatile DRAMs with Ferroelectric Capacitors", IEICE Trans. Electron., Vol. E79-C, pp. 234–242 (1996), for example, a ferroelectric memory performs a read or write operation absolutely similarly to the DRAM, in a general state other than a power on/off state.

In this system, no cell plate potential may be driven but a pair of bit lines are precharged at Vcc/2 in a standby state. Such a mode of using a nonvolatile memory in an operation similar to that of the DRAM is referred to as a DRAM mode.

The most serious drawback of the DRAM mode for preventing deterioration of ferroelectric film characteristics resides in that a refresh operation is required similarly to the DRAM. If the memory is integrated into a system, a complicated operation is required for issuing an instruction or timing for the refresh operation, and the refresh operation regularly consumes power.

Japanese Patent Laying-Open No. 7-244988 (1995) discloses a system of driving only a frequently accessed area into the DRAM mode while bringing areas not accessed in excess of a constant time into the nonvolatile mode thereby suppressing power consumption following the refresh operation.

FIG. 37 is a block diagram showing the structure of the semiconductor memory device disclosed in Japanese Patent Laying-Open No. 7-244988.

The semiconductor memory device shown in FIG. 37 employs ferroelectric capacitors as information storage capacitors of memory cells and comprises a continuous refresh count control circuit 614, a mode conversion circuit 612, a mode storage memory 618 and a mode determination circuit 616, in addition to a conventional DRAM comprising a memory mat 608, an X decoder 610, a Y decoder 604, a Y switch 606, a refresh activation circuit 624, an X address selector circuit 622, a Y address selector circuit 620, a timing control circuit 626 and an input/output buffer 602.

The X address selector circuit 622 fetches and holds an address signal inputted in synchronization with a row address strobe signal.

The Y address selector circuit 620 fetches and holds an address signal inputted in synchronization with a column address strobe signal.

The X decoder 610 decodes the X address signal and selects a word line of the memory mat 608. The Y decoder 604 decodes the Y address signal, forms a column selector signal for a complementary data line of the memory mat 608, and controls the Y switch 606. The Y switch 606 connects the complementary data line selected by the column selector signal to the input/output buffer 602.

The timing control circuit 626 receives the row address strobe signal, the column address strobe signal and a write enable signal, identifies a read/write or refresh operation mode, and forms an internal timing signal corresponding thereto.

The refresh activation circuit 624 outputs a refresh address to the X decoder 610 when in the refresh mode.

The memory mat 608 is split into a plurality of memory blocks, and the mode storage memory 618 stores whether the operation mode of each memory block is the DRAM or nonvolatile mode. The continuous refresh count control circuit 614 counts the refresh operation for each memory block, and resets the count value when a read or write operation is performed for any memory cell included in each memory block.

When the refresh activation circuit 624 makes a refresh operation, the mode determination circuit 616 reads mode information of a memory block stored in the mode storage memory 618 by a refresh address signal therefore and determines whether the memory block is in the DRAM mode or the nonvolatile mode.

If the memory block is in the DRAM mode, the mode determination circuit 616 performs the refresh operation as such and makes the continuous refresh count control circuit 614 count +1.

If the memory block is in the nonvolatile mode, on the other hand, the mode determination circuit 616 omits the refresh operation. Namely, the mode determination circuit 616 omits an operation of selecting any word line or activating a sense amplifier by the X decoder 610.

When the X address selector circuit 622 accesses any memory cell for writing or reading data, the mode determination circuit 616 makes the continuous refresh count control circuit 614 reset the refresh count of the corresponding memory block to zero, and brings the mode storage memory 618 into the DRAM mode through the mode conversion circuit 612. This mode conversion can be omitted if the mode storage memory 618 is already in the DRAM mode.

When the refresh operation is performed by a predetermined count, the continuous refresh count control circuit 614 instructs the mode conversion circuit 612 to convert the mode of the memory block. In the refresh operation, the mode conversion circuit 612 temporarily raises the plate voltage of the memory block from a ground potential to a power supply potential Vcc, for example, for performing writing accompanied by inversion of the polarization of the ferroelectric capacitors in rewriting by the refresh operation.

The mode conversion circuit 612 makes the mode storage memory 618 store the nonvolatile mode.

FIG. 38 is a schematic block diagram for illustrating examples of the memory mat 608 and the continuous refresh count control circuit 614 in the conventional semiconductor memory device.

FIG. 38 illustratively shows a circuit which is applied to the memory mat 608 split in units of word lines and corresponding to an i-th word line WLi as a representative.

Referring to FIGS. 37 and 38, the continuous refresh count control circuit shown in this example is provided with a plurality of dynamic memory cells on the word line WLi identical to that for the memory mat 608, to be employed as a continuous refresh count storage circuit.

Assuming that the continuous refresh count is three, for example, two memory cells M1i and M2i are provided in a continuous refresh count FT(i) storage memory.

An FTRW circuit 634 reads counts stored in the memory cells M1i and M2i, adds +1 thereto and rewrites the results in the memory cells M1i and M2i.

In a third refresh operation when the storage information of both memory cells M1i and M2i becomes 1, a timing pulse $\phi$ VPL is generated for temporarily converting a plate potential VPLi of a ferroelectric capacitor CMi corresponding to the word line WLi performing refreshment to a high level in correspondence to the timing pulse $\phi$ VPLi through a gate circuit G supplied with a selector signal for the word line WLi in its one input.

Thus, the direction of polarization of the memory cell coupled to the word line WLi in the continuous third refresh operation is decided in correspondence to the storage information in rewriting. The refresh operation is thereafter not necessary because of non-volatization, the refresh operation is omitted.

An operation of switching the conventional semiconductor memory device from the DRAM mode to the nonvolatile mode is now described.

FIG. 39 is an operating waveform diagram showing an operation of non-volatilizing the semiconductor memory device storing H data.

FIGS. 41A and 41B illustrate polarized states of a ferroelectric film on hysteresis characteristics.

Referring to FIGS. 38, 39, 41A and 41B, the potential of the word line WLi rises from 0 V to 5 V to be selected in a state 1, whereby the potential of a bit line BLi connected with the memory cell storing the H data slightly rises and is converted to 5 V by a sense amplifier. At this time, the plate potential VPLi is 0 V. The ferroelectric capacitor Cmi enters the polarized state 1 shown in FIG. 41A.

In a state 2, the plate potential VPLi rises from 0 V to 5 V. Both electrodes of the ferroelectric capacitor Cmi are supplied with the same potential in this state 2, whereby the ferroelectric capacitor Cmi enters the polarized state 2 shown in FIG. 41B in correspondence to the voltage of 0 V.

In a state 3, the plate potential VPLi changes from 5 V to 0 V and the voltage of 5 V is applied to the electrodes of the ferroelectric capacitor Cmi again, whereby the ferroelectric capacitor Cmi enters the polarized state 3 shown in FIG. 41A.

Thus, the semiconductor memory device enters the nonvolatile mode.

The semiconductor memory device thereafter performs no refresh operation in this nonvolatile mode, whereby the potential of a storage node reduces to a low level by a leakage current in a state 4 and no voltage is applied between the electrodes of the ferroelectric capacitor Cmi, for holding information by remanent polarization as shown in the state 4 in FIG. 41B.

FIG. 40 is an operating waveform diagram of an operation for bringing the semiconductor memory device storing L data into the nonvolatile mode.

FIGS. 42A and 42B illustrate polarization of the ferroelectric film on the hysteresis characteristics.

Referring to FIGS. 40, 42A and 42B, the word line WLi is selected and its potential rises from 0 V to 5 V in a state 1. Slight change appears on the bit line BLi on the basis of the stored L data, and the sense amplifier amplifies this change to reduce the potential of the bit line BLi to 0 V. In this state, a voltage of 0 V is applied between the electrodes of the ferroelectric capacitor Cmi, which in turn enters the polarized state 1 shown in FIG. 42A.

In a state 2, the plate potential VPLi changes from 0 V to 5 V and a voltage of −5 V is applied between the electrodes of the ferroelectric capacitor Cmi, which in turn enters the polarized state 2 shown in FIG. 42B.

In a state 3, the plate potential VPLi is converted from 5 V to 0 V, whereby the potential difference between the electrodes of the ferroelectric capacitor Cmi becomes 0 V and the ferroelectric film is polarized as shown in the state 3 in FIG. 42*b*.

Thus, the semiconductor memory device enters the nonvolatile mode. The semiconductor memory thereafter performs no refresh operation in such a nonvolatile mode, thereby holding negative remanent polarization as storage data, as shown in the state 4 in FIG. 42B.

When the word line WLi is selected by a read operation, a slight high level is outputted to the bit line BLi with respect to a half precharge voltage of 2.5 V serving as a reference voltage in correspondence to the remanent polarization in the state 4 shown in FIG. 39 or a slight low level is outputted in the state 4 in FIG. 40 so that the sense amplifier amplifies this output for rewriting the high or low level in the ferroelectric capacitor, whereby a read signal corresponding to the direction of polarization can be obtained as shown in the state 1 in FIG. 41A or in the state 2 shown in FIG. 42B, and the semiconductor memory device thereafter operates in the DRAM mode.

In the DRAM mode, the plate potential VPLi is fixed to the ground potential of the circuit, whereby the polarization of the ferroelectric capacitor Cmi remains unchanged for storing high or low level information as a simple capacitor.

The method shown in Japanese Patent Laying-Open No. 7-244988 is adapted to equivalently recognize the time when a certain area is not accessed by counting the refresh count. However, the refresh count is decided by the external specification (user state), and hence the time for switching the DRAM mode to the nonvolatile mode depends on the external specification (user state).

Namely, the time operating in the DRAM mode fluctuates to change the power consumption.

In case of adjusting the time for switching the DRAM mode to the nonvolatile mode in response to requirement for power consumption responsive to the employment, it is difficult to remarkably change the switching time in the method described in Japanese Patent Laying-Open No. 7-244988, due to the employment of the memory cell dedicated to mode storage.

In case of a DRAM, a bit line precharge potential and a cell plate potential are generally Vcc/2. When a ferroelectric memory is used in the nonvolatile mode, on the other hand, the bit line precharge potential and the cell plate potential are generally Vcc or the ground potential.

In case of switching the mode following such conventional use of the DRAM or the ferroelectric memory, the levels of the bit line precharge potential and the cell plate potential must also be switched at the same time.

SUMMARY OF THE INVENTION

An object of the present invention is to provide a semiconductor memory device stably performing an operation with low power consumption, by making a prescribed waiting time for a memory block to be switched from a DRAM mode to a nonvolatile mode hardly influenced by external specification (user state) in such a ferroelectric memory that an accessed block enters the DRAM mode and the remaining areas automatically enter the nonvolatile mode after a lapse of a certain period.

Briefly stated, the present invention provides a semiconductor memory device, which comprises a memory cell array, an access detection circuit, a plurality of mode set circuits, a refresh circuit, and a mode switching circuit.

Memory cells including ferroelectric capacitors and access transistors for accessing the ferroelectric capacitors are arranged on the memory cell array in the form of a matrix, and the memory cell array is split into a plurality of memory blocks. The access detection circuit detects that data of each memory block is accessed from the exterior. The plurality of mode set circuits are provided in correspondence to the plurality of memory blocks respectively, so that each mode set circuit receives an output of the access detection circuit and sets an operation mode of the corresponding memory block in a first mode when a non-accessed period of the memory block not accessed from the exterior exceeds a prescribed waiting time while setting the operation mode in a second mode when the non-accessed period is not in excess of the prescribed waiting time. Each mode set circuit includes a timer circuit for counting the non-accessed period on the basis of a reference clock. The refresh circuit stops data refreshment of each memory block when its operation mode is the first mode, while making data refreshment of each memory block when its operation mode is the second mode. The mode switching circuit switches the operation of each memory block for holding the data written in its memory cell as the remanent polarization quantity of the ferroelectric capacitor when the operation mode is the first mode while holding the data by potential difference between electrodes of the ferroelectric capacitor when the operation mode is the second mode.

Thus, a principal advantage of the present invention resides in that each memory block is switched to the nonvolatile mode when not accessed so that the ferroelectric capacitor causes no polarization inversion during this period, whereby fatigue of the ferroelectric can be suppressed. Another advantage of the present invention resides in that refreshment of each memory block is stopped when the same is in the nonvolatile mode, whereby power consumption of the semiconductor memory device can be reduced. Still another advantage of the present invention resides in that the timer circuit manages the waiting time for switching on the basis of the reference clock when switching the operation mode of the semiconductor memory device, whereby the power consumption is hardly influenced by the external specification (user state) and can be stably suppressed.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a block diagram showing the structure of a semiconductor memory device 1000 according to an embodiment 1 of the present invention;

DESCRIPTION OF THE PREFERRED EMBODIMENTS

Embodiment 1

Figure 2:
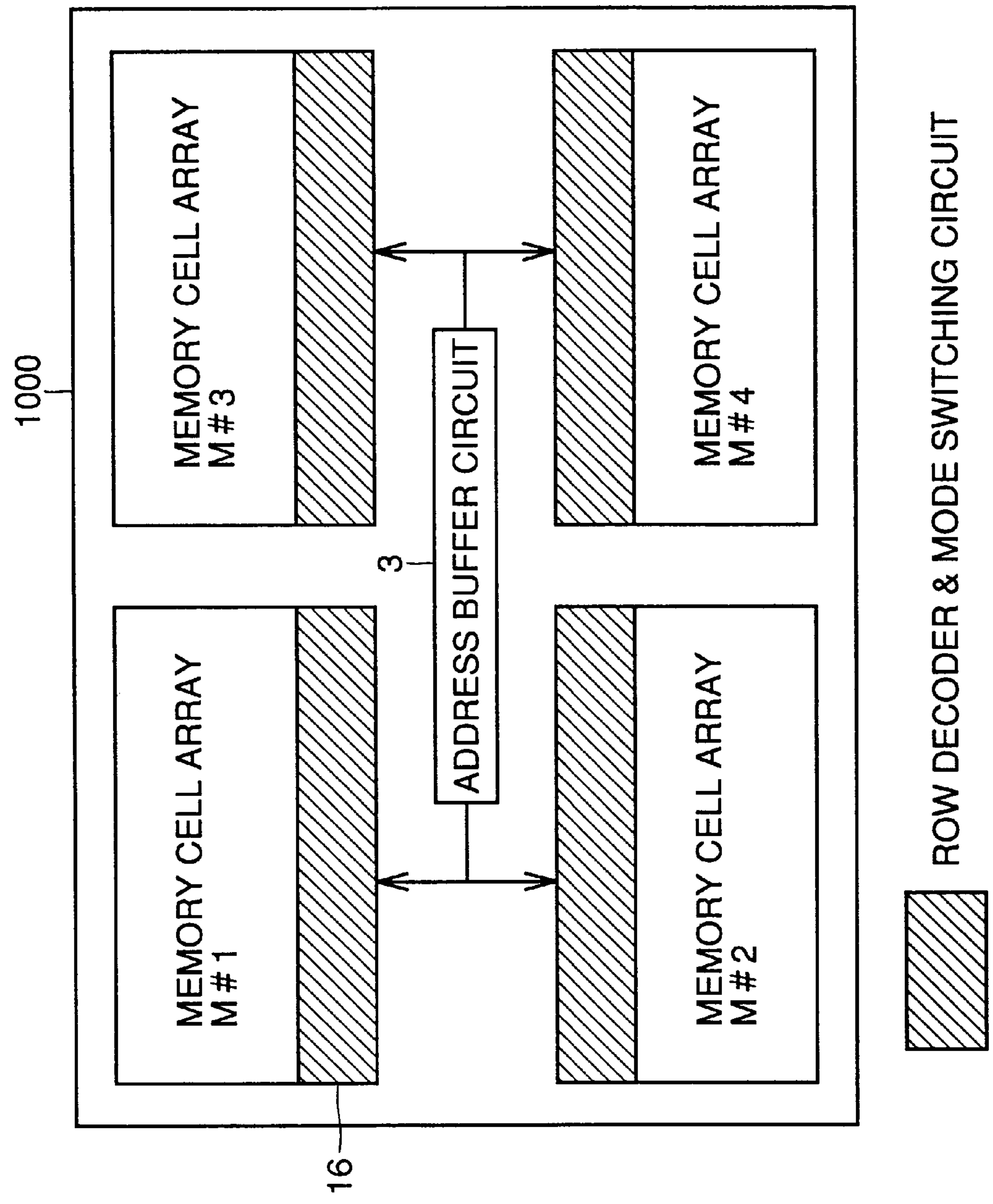
FIG. 2 illustrates exemplary splitting of memory blocks of the semiconductor memory device 1000 according to the embodiment 1.

FIG. 1 is a block diagram showing the structure of a semiconductor memory device 1000 according to an embodiment 1 of the present invention.

Referring to FIG. 1, the semiconductor memory device 1000 includes four memory cell arrays M#1 to M#4 which are isolated from each other by central regions CR1 and CR2 existing along the long and short edge directions respectively.

In correspondence to each memory cell array, the semiconductor memory device 1000 is provided with a row selector circuit 16 (a row predecoder, a row decoder and a word line driver) and a column selector circuit 18 (a column predecoder, a column decoder and an I/O gate), for selecting any memory cell in accordance an externally supplied address signal.

Each of the memory cell arrays M#1 to M#4 is split into 16 column groups, for example, and a global I/O line pair GIOP is arranged for each corresponding column group. When any of the memory cell arrays M#1 to M#4 is selected, a 1-bit memory cell is selected in each column group and coupled with the global I/O line pair GIOP therefore.

The semiconductor memory device 1000 further includes preamplifiers/write buffers 7 provided in correspondence to the global I/O line pairs GIOP for inputting/outputting data in/from the corresponding global I/O line pairs GIOP respectively, read drivers 8 provided in correspondence to the preamplifiers/write buffers 7 for amplifying internal read data supplied from the corresponding preamplifiers and transmitting the same to corresponding read data buses RDAB (RDABa to RDABd) respectively, and a driver circuit 11 for receiving signals from the read data buses RDABa to RDABd and selectively transmitting the supplied signals to an output buffer 13 through output buses RDB.

The preamplifiers/write buffers 7 transmit memory cell data of column groups selected in the memory cell arrays M#1 to M#4 to the corresponding read data buses RDABa to RDABd through the read drivers 8 respectively.

The write buffers of the preamplifiers/write buffers 7 are coupled to an input buffer 12 through an input data bus WD. The write buffer 7 corresponding to a selected one of the memory cell arrays M#1 to M#4 is activated so that data is written in a selected memory cell included in a selected column group of the selected memory cell array through the write buffer 7.

The semiconductor memory device 1000 further includes an address buffer 3 receiving the externally supplied address signal and generating an internal address signal, an ATD generation circuit 4 detecting translation of the internal address signal (internal column address signal) supplied from the address buffer 3 and generating an address translation detection signal ATD, a PAE generation circuit 5 generating a preamplifier enable signal PAE for activating the preamplifier included in any preamplifier/write buffer 7 in response to the address translation detection signal ATD from the ATD generation circuit 4, an IOEQ generation circuit 6 generating an equalization instruction signal IOEQ for equalizing any global I/O line pair GIOP in response to the address translation detection signal ATD from the ATD generation circuit 4, and a control circuit 10 receiving an externally supplied row address strobe signal /RAS, a column address strobe signal /CAS, a write enable signal /WE and the internal address signal supplied from the address buffer 3 and outputting a signal for controlling the operation of the semiconductor memory device 1000.

Each global I/O line pair GIOP, which is formed by a complementary signal line pair, transmits complementary data signals. The equalize signal IOEQ is adapted to equalize the potentials of the global I/O lines forming each global I/O line pair GIOP.

The semiconductor memory device 1000 further includes an internal down converting circuit 29 receiving an externally supplied power supply potential Vdd and generating an internal power supply potential Vcc which is lower than the external power supply potential Vdd, a substrate potential generation circuit 30 for receiving the external power supply potential Vdd and a ground potential Vss and generating a negative substrate potential Vbb, a up converting circuit 31 receiving the external power supply potential Vdd and the ground potential Vss and generating a boosted potential Vpp which is stepped up as compared with the external power supply potential Vdd, a cell plate potential generation circuit 33 receiving the external power supply potential Vdd and the ground potential Vss and generating a cell plate potential Vcp0, and a bit line precharge potential generation circuit 35 receiving the external power supply potential Vdd and the ground potential Vss and generating a bit line precharge potential Vb10.

The internal power supply potential Vcc is applied to circuits (sense amplifiers charging/discharging bit lines) for driving the memory cell arrays M#1 to M#4.

The input and output buffers 12 and 13 input and output data from and to the exterior of the device through common data input terminals DQ0 to DQi.

Figure 3:
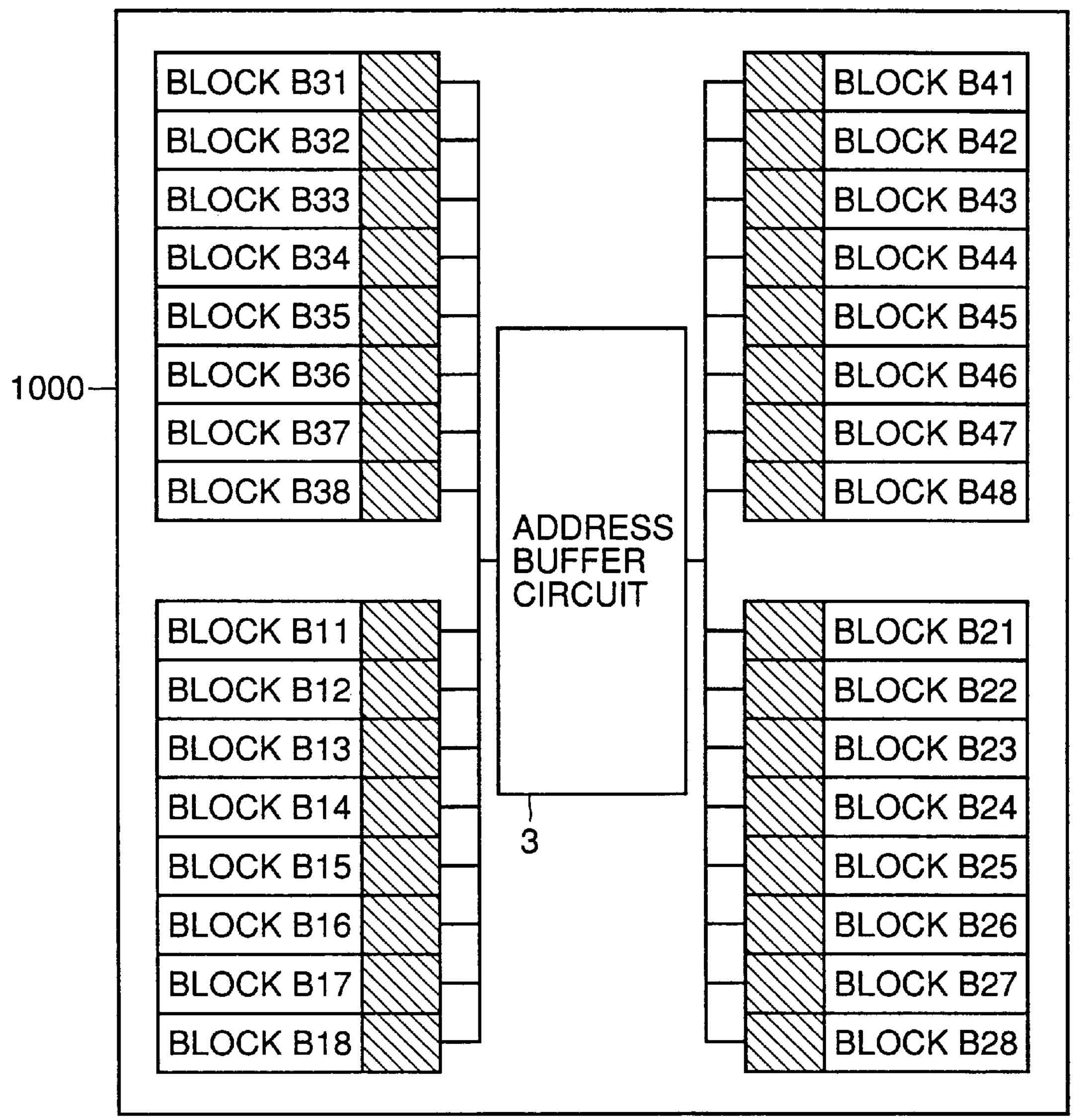
FIG. 3 illustrates another exemplary splitting of memory blocks of the semiconductor memory device 1000 according to the embodiment 1.

FIGS. 2 and 3 are conceptual diagrams showing exemplary splitting of blocks at chip levels.

FIG. 2 shows the case of switching a DRAM mode and a nonvolatile mode in units of large memory cell arrays, and FIG. 3 expresses the case of performing mode switching in units of more finely split small memory blocks.

Referring to FIG. 3, the memory cell arrays M#1 to M#4 of the semiconductor memory device 1000 are split into blocks B11 to B18, B21 to B28, B31 to B38 and B41 to B48 respectively.

In case of splitting each memory cell array into a large number of blocks as shown in FIG. 3, the mode is switched in a limited operating area and hence an effect of lower power consumption can be readily attained by reducing a refresh operation. In particular, a space accessed in a specific period is extremely limited in a mass storage memory of the gigabit level, and hence it is useful to increase the number of the blocks.

The term "split" is used with reference to capacitance units to be switched between the DRAM mode and the nonvolatile mode. Therefore, the units may not necessarily coincide with those for splitting a memory cell array in a sense amplifier or the like in general.

While the blocks are preferably uniformly split in general, the same may be non-uniformly split. The following description is made with reference to the case shown in FIG. 3.

Figure 4:
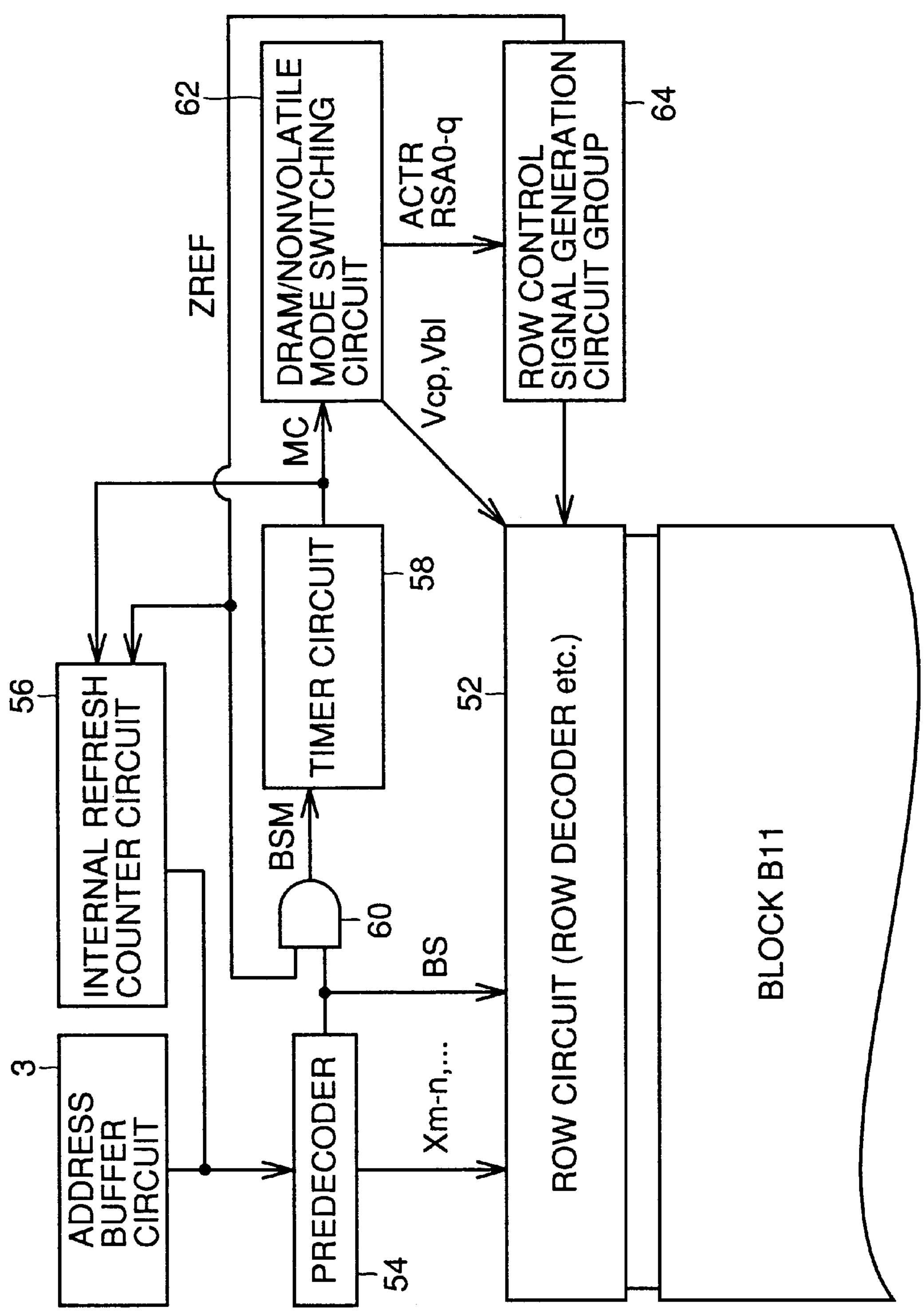
FIG. 4 is a schematic block diagram showing the structure of a memory block B11 according to the embodiment 1.

FIG. 4 is a schematic block diagram showing the structure of the block B11 among the blocks B11 to B18, B21 to B28, B31 to B38 and B41 to B48 shown in FIG. 3.

Referring to FIG. 4, the address buffer circuit 3 receives a row address inputted from the exterior or outputted from an internal refresh counter and outputs the same to a predecoder 54. The predecoder 54 receives the row address and outputs a predecode signal Xm-n and a block selector signal BS. A row decoder in a row circuit 52 receives the predecode signal Xm-n and the block selector signal BS and finally specifies a single word line, and a word line driver drives this word line.

A timer circuit 58 receives the block selector signal BS through a gate circuit 60 and measures a non-accessed time of the block B11. When the non-accessed time exceeds a constant time, the timer circuit 58 outputs a mode switching signal MC to a DRAM/nonvolatile mode switching circuit 62. The DRAM/nonvolatile mode switching circuit 62 supplies a cell plate potential Vcp and a bit line precharge potential Vb1 to the block B11 in response to the mode switching signal MC, for bringing the memory block B11 into the nonvolatile mode.

In case of switching the memory block B11 from the nonvolatile mode to the DRAM mode, the DRAM/nonvolatile mode switching circuit 62 outputs a row activation signal ACTR and a refresh initial address RSA0-q to a row control signal generation circuit group 64.

Figure 5:
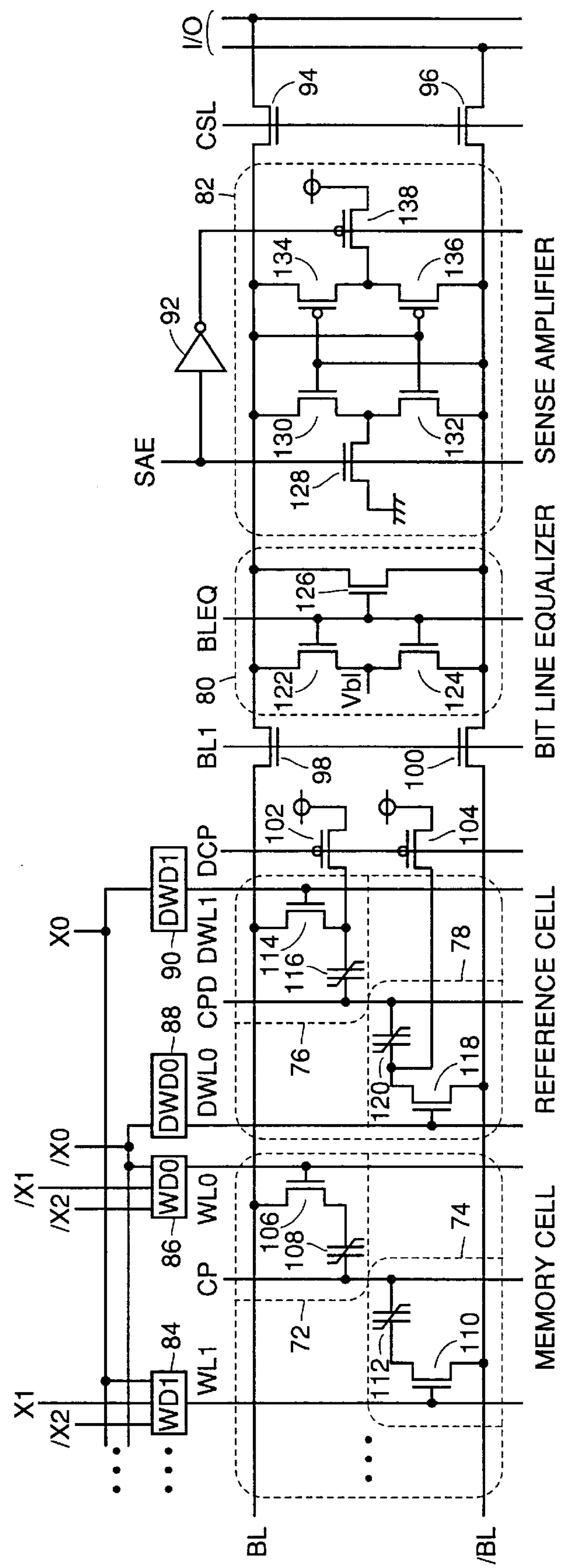
FIG. 5 is a circuit diagram showing the structure of the memory block B11 appearing in FIG. 4 in detail.

FIG. 5 is a circuit diagram showing the block B11 appearing in FIG. 4 in detail.

Referring to FIG. 5, the block B11 includes bit lines BL and /BL, an equalizer circuit 80 supplying equal voltages when precharging the bit lines BL and /BL, transistors 98 and 100 connecting the bit lines BL and /BL with the equalizer circuit 80 respectively, memory cells 72 and 74 connected with the bit lines BL and /BL respectively, reference cells 76 and 78 connected with the bit lines BL and /BL respectively for generating reference potentials in reading from the memory cells 72 and 74, P-channel transistors 102 and 104 supplying the power supply potential to storage nodes of reference cell plates, a sense amplifier 82 amplifying differences between bit line potentials in information reading from the memory cells 72 and 74 and potentials read from the reference cells 76 and 78, and transistors 94 and 96 transmitting the information amplified by the sense amplifier 82 to I/O lines.

For convenience of illustration, FIG. 5 shows decoder circuits 84 and 86 and level conversion circuits 88 and 90 included in the row circuit 52 shown in FIG. 4 and an invertor 92 supplying complementary signals to the sense amplifier 82.

As to the memory cells 72 and 74 and the decoder circuits 84 and 86, FIG. 5 illustrates only those corresponding to word lines WL1 and WL0 and omits the remaining ones.

The memory cell 72 includes a ferroelectric capacitor 108 having a first electrode connected to a cell plate CP and an access transistor 106 connecting a second electrode of the ferroelectric capacitor 108 to the bit line BL. The gate of the access transistor 106 is connected to the word line WL0.

The memory cell 74 includes a ferroelectric capacitor 112 having a first electrode connected to the cell plate CP and an access transistor 110 connecting a second electrode of the ferroelectric capacitor 112 to the bit line BL. The gate of the access transistor 110 is connected with the word line WL1.

The reference cell 76 includes a ferroelectric capacitor 116 having a first electrode connected to a cell plate CPD and an access transistor 114 connecting a second electrode of the ferroelectric capacitor 116 to the bit line BL, and the gate of the access transistor 114 is connected with a word line DWL1.

The P-channel transistor 102 receiving a signal DCP in its gate couples the storage node of the reference cell 76 to the power supply potential.

The reference cell 78 includes a ferroelectric capacitor 120 having a first electrode connected to the cell plate CPD and an access transistor 118 connecting a second electrode of the ferroelectric capacitor 120 to the bit line /BL.

The gate of the access transistor 118 is connected with a word line DWL0. The P-channel transistor 104 receiving the signal DCP in its gate couples the storage node of the reference cell 78 to the power supply potential.

The equalizer circuit 80 includes a transistor 122 receiving an equalize signal BLEQ in its gate and coupling the bit line precharge potential Vb1 with the bit line BL, a transistor 124 receiving the equalize signal BLEQ in its gate and coupling the bit line precharge potential Vb1 with the bit line /BL, and a transistor 126 receiving the equalize signal BLEQ in its gate and coupling the bit liens BL and /BL with each other.

The sense amplifier 82 includes an N-channel transistor 128 which is activated by a sense amplifier activation signal for supplying the ground potential to the sense amplifier 82, a P-channel transistor 138 which is activated by the sense amplifier activation signal for supplying the power supply potential to the sense amplifier 82, an N-channel transistor 130 and a P-channel transistor 134 forming an invertor receiving the potential of the bit line /BL in its gate and outputting the inverted potential to the bit line BL in activation of the N-channel transistor 128 and the P-channel transistor 138, and an N-channel transistor 132 and a P-channel transistor 136 forming an invertor receiving the potential of the bit line BL in its gate and outputting the inverted potential to the bit line /BL.

Figure 6:
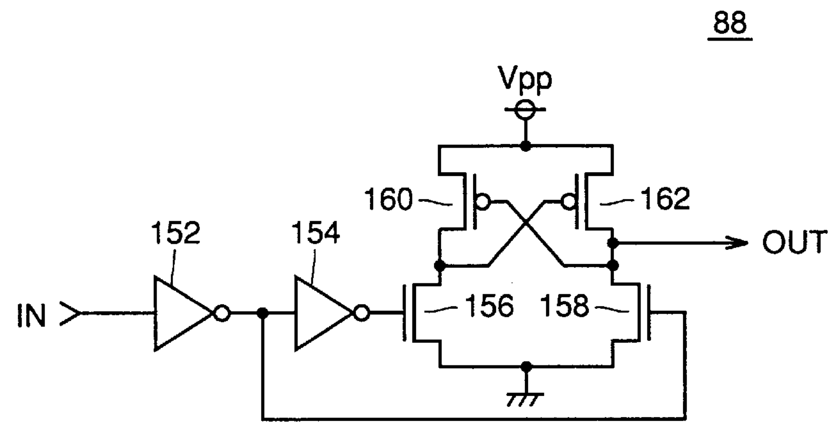
FIG. 6 is a circuit diagram showing the structure of a level conversion circuit 88 appearing in FIG. 5 in detail.

FIG. 6 is a circuit diagram showing the level conversion circuit 88 appearing in FIG. 5 in detail.

Referring to FIG. 6, the level conversion circuit 88 includes an invertor 152 receiving an input signal IN, an invertor 154 receiving an output of the invertor 152, and N-channel transistors 158 and 156 receiving outputs of the invertors 152 and 154 in the gates thereof respectively. The sources of the N-channel transistors 156 and 158 are coupled with the ground potential. The level conversion circuit 88 further includes a P-channel transistor 160 coupling the drain of the N-channel transistor 156 with the internal step-up potential Vpp, and a P-channel transistor 162 coupling the drain of the N-channel transistor 158 with the internal step-up potential Vpp. The gate of the P-channel transistor 160 is connected with the drain of the N-channel transistor 158. The gate of the P-channel transistor 162 is connected with the drain of the N-channel transistor 156. The drain of the N-channel transistor 158 outputs an output signal OUT.

The level conversion circuit 90 shown in FIG. 5 has the same structure as the level conversion circuit 88 shown in FIG. 6. The decoder circuits 84 and 86 include selector circuits receiving signals from predecoders and selecting word lines and similar level conversion circuits for level-converting outputs thereof.

Figure 7:
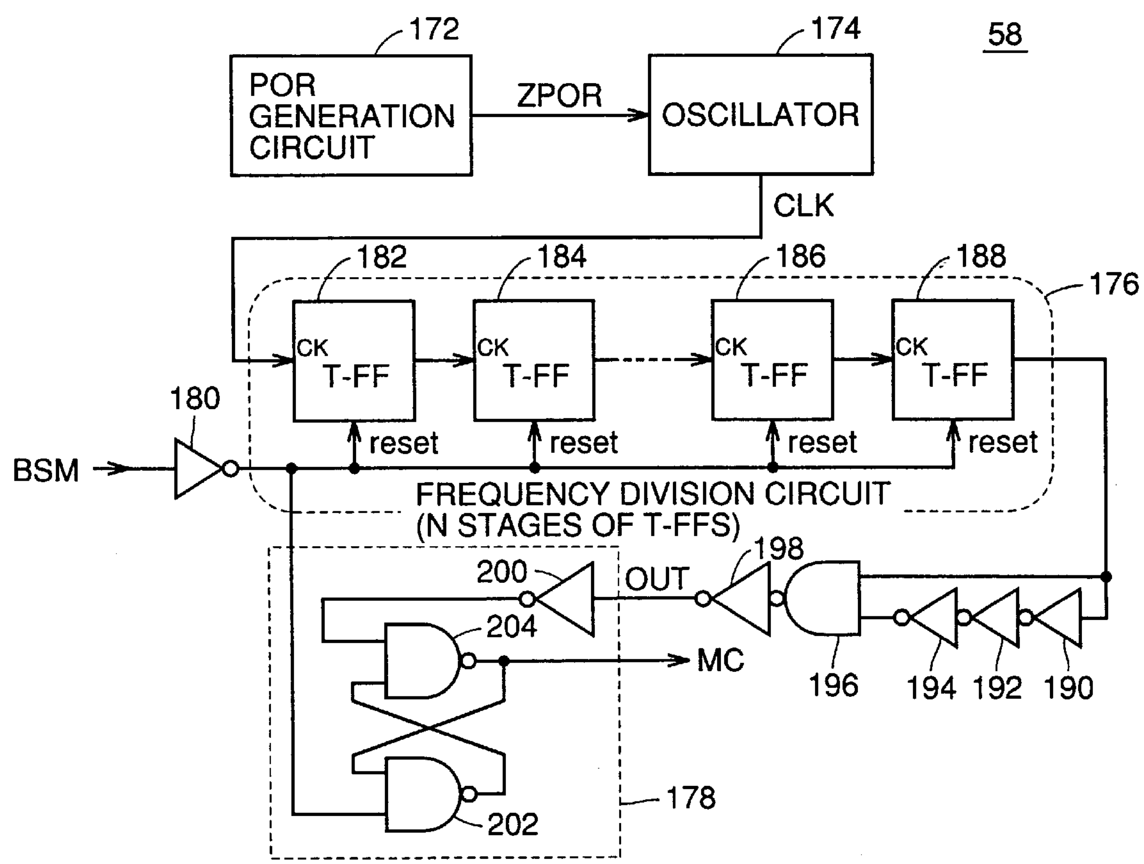
FIG. 7 is a circuit diagram showing the structure of a timer circuit 58 appearing in FIG. 4 in detail.

FIG. 7 is a circuit diagram showing the timer circuit 58 appearing in FIG. 4 in detail.

Referring to FIG. 7, the timer circuit 58 includes a POR generation circuit 172 generating a reset signal ZPOR for inactivating the circuit 58 until the power supply voltage reaches a prescribed value, an oscillator 174 receiving the reset signal ZPOR outputted from the POR generation circuit 172 for starting oscillation and generating a reference clock CLK when the reset signal ZPOR is canceled, an invertor 180 receiving a block selector signal BSM which goes high when the memory block B11 is accessed from the exterior, a frequency division circuit 176 which is released from resetting for starting counting the reference clock CLK when an output signal from the invertor 180 changes from a low level to a high level, serially connected invertors 190, 192 and 194 receiving an output signal of the frequency division circuit 176, a NAND circuit 196 receiving output signals of the frequency division circuit 176 and the invertor 194, an invertor 198 inverting an output of the NAND circuit 196, and a state hold circuit 178 which is set by the output signal OUT of the invertor 198 and reset by the output signal of the invertor 180.

The frequency division circuit 176 includes a T flip-flop (hereinafter referred to as a T-FF) 182 receiving the reference clock CLK, a T-FF 184 receiving an output of the T-FF 182, a T-FF 186 receiving an output of the T-FF 184, and a T-FF 188 receiving an output of the T-FF 186. The TFFs 182 to 188 are reset when the output signal of the invertor 180 is at a low level, i.e., when the block selector signal BSM is at a high level. A necessary number of serially connected T-FFs are added between the T-FFs 184 and 186 at need.

The state hold circuit 178 includes an invertor 200 receiving and inverting the output of the invertor 198, a NAND circuit 202 receiving the output of the invertor 180, and a NAND circuit 204 receiving both outputs from the NAND circuit 202 and the invertor 200. An output of the NAND circuit 204 is connected to an input of the NAND circuit 202 and becomes the mode switching signal MC indicating the state of the memory block B11. The mode switching signal MC goes low when the memory block B11 is in the DRAM mode, and goes high when the memory block B11 is in the nonvolatile mode.

Figure 8:
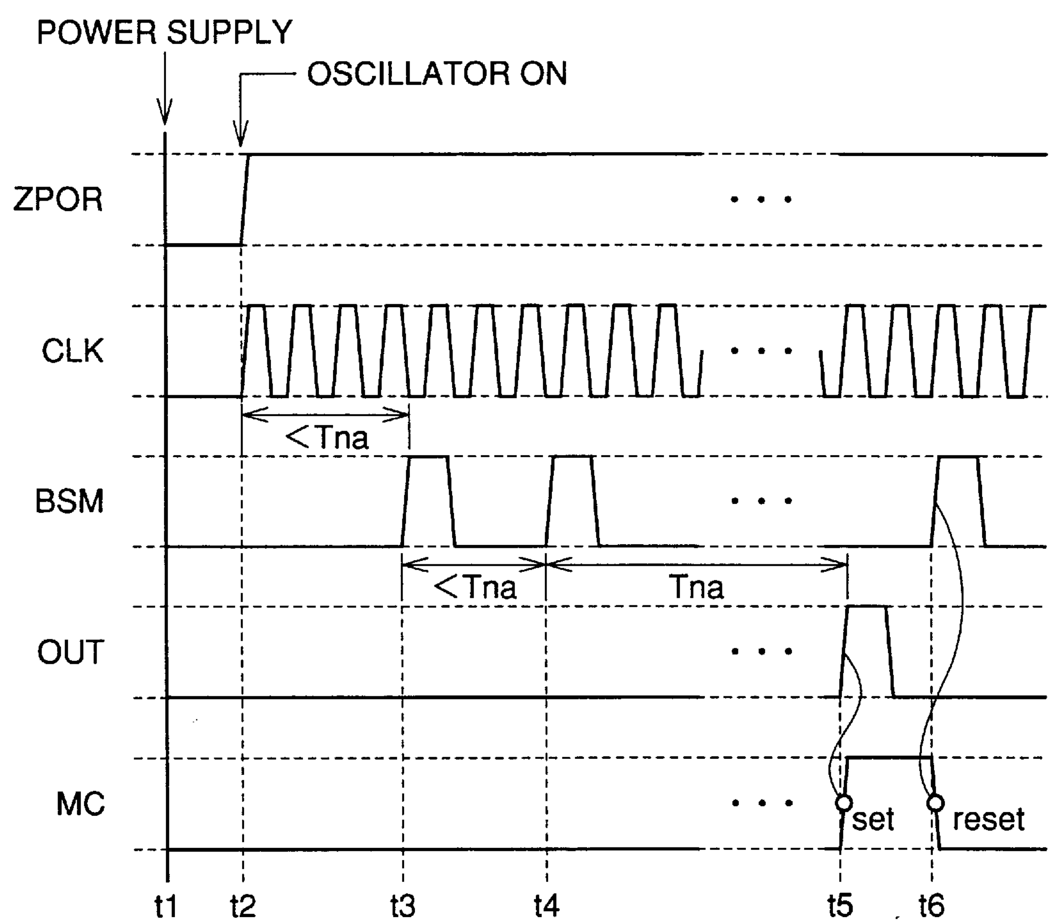
FIG. 8 is an operating waveform diagram illustrating the operation of the timer circuit 58 shown in FIG. 7.

FIG. 8 is an operating waveform diagram showing the operation of the timer circuit 58 shown in FIG. 7.

Referring to FIGS. 7 and 8, power is supplied at a time t1. At a time t2, the POR generation circuit cancels the reset signal ZPOR. The oscillator 174 starts oscillating in response to this, to generate the reference clock CLK. At a time t3, the memory block B11 is accessed from the exterior and the block selector signal BSM goes high. The elapsed time between the times t2 and t3 is smaller than a set waiting time Tna, and hence the memory block B11 remains in the DRAM mode and the mode switching signal MC remains at the low level.

At a time t4, the memory block B11 is accessed from the exterior again, and the block selector signal BSM rises from a low level to a high level again. Also in this case, the elapsed time between the times t3 and t4 is smaller than the set waiting time Tna and hence the memory block B11 remains in the DRAM mode.

No access is made from the exterior at a time t5 after a lapse of the set waiting time Tna, and hence the timer circuit 58 detects the lapse of the prescribed waiting time Tna, and the signal OUT rises from a low level to a high level. In response to this, the mode switching signal MC changes from the low level to a high level. Thus, the memory block B11 is set in the nonvolatile mode.

At a time t6, the memory block B11 set in the nonvolatile mode is accessed from the exterior again, and the block selector signal BSM rises from a low level to a high level again. In response to this, the mode switching signal MC is reset from the high level to a low level.

Thus, the memory block B11 changes from the nonvolatile mode to the DRAM mode again.

As hereinabove described, the timer circuit 58 shown in FIG. 7 measures the waiting time Tna for shifting the memory block B11 not accessed in the DRAM mode to the nonvolatile mode in its internal timer circuit. Thus, the timer circuit 58 uses no refresh cycle which is influenced by the external specification (user state) of the semiconductor memory device 1000, whereby a stable effect of lower power consumption can be attained.

Figure 9:
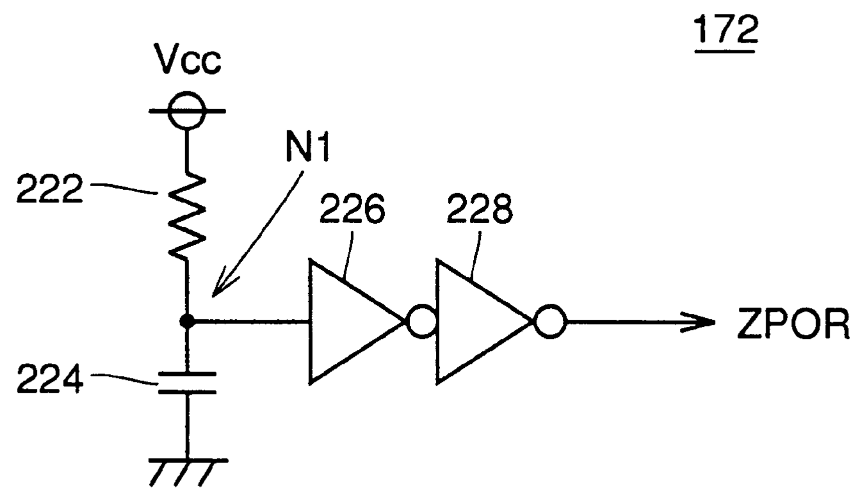
FIG. 9 is a circuit diagram showing the structure of a POR generation circuit 172 appearing in FIG. 7 in detail.

FIG. 9 is a circuit diagram showing the POR generation circuit 172 appearing in FIG. 7 in detail.

Referring to FIG. 9, the POR generation circuit 172 includes a capacitor 224 having electrodes which are coupled to the ground potential and connected to a node N1 respectively, a resistance 222 coupling the node N1 with the internal power supply potential Vcc, and serially connected invertors 226 and 228 receiving the potential of the node N1 in inputs thereof.

Figure 10:
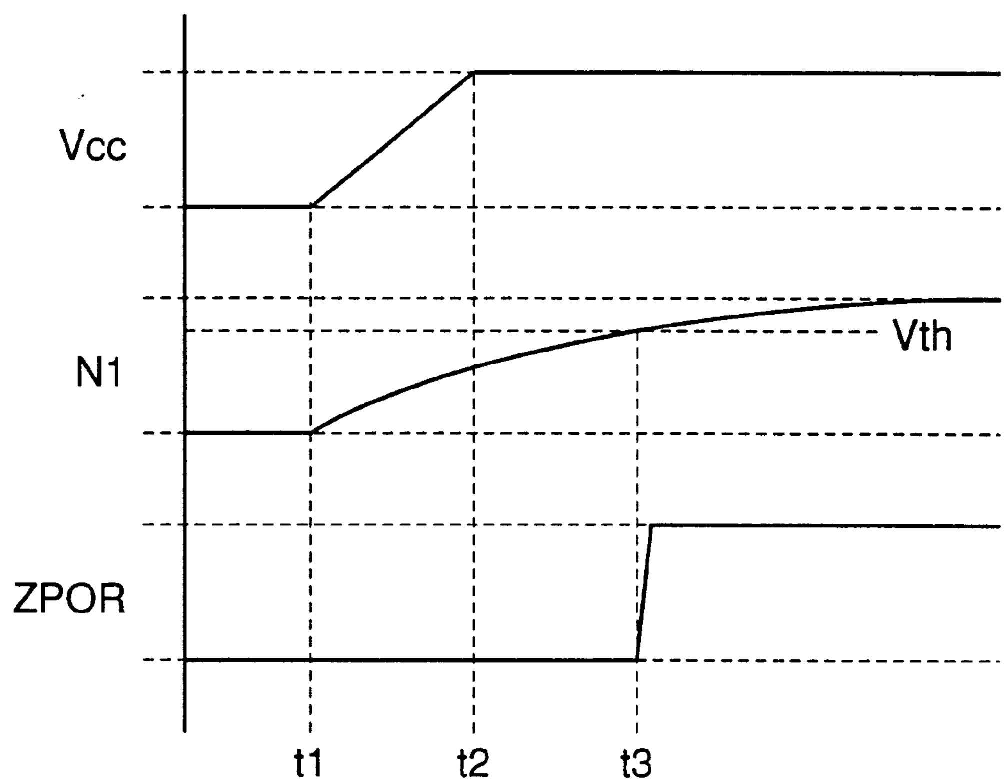
FIG. 10 is an operating waveform diagram illustrating the operation of the POR generation circuit 172 shown in FIG. 9.

FIG. 10 is an operating waveform diagram for illustrating the operation of the POR generation circuit 172 shown in FIG. 9.

Referring to FIGS. 9 and 10, power is supplied to the semiconductor memory device 1000 at a time t1, and the internal power supply potential Vcc starts rising.

At a time t2, the internal power supply potential Vcc rises to a prescribed level and is stabilized. At this time, the potential of the node N1 is charged in accordance with a time constant decided by the product of the resistance value of the resistance 222 and the capacitance value of the capacitor 224.

At a time t3, the potential of the node N1 exceeds the logical threshold value Vth of the invertor 226. The reset signal ZPOR outputted from the POR generation circuit 172 changes from a low level to a high level, to cancel the resetting.

The POR generation circuit 172, which is necessary for inactivating principal circuits on the chip until the power sufficiently rises, can be shared by the overall chip.

Figure 11:
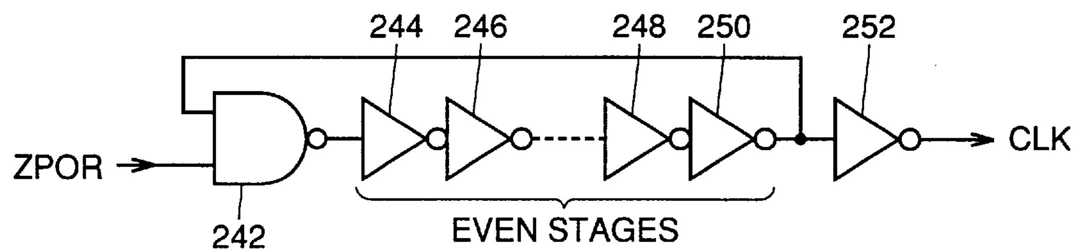
FIG. 11 is a circuit diagram showing the structure of an oscillator 174 appearing in FIG. 7 in detail.

FIG. 11 is a circuit diagram showing the oscillator 174 appearing in FIG. 7 in detail.

Referring to FIG. 11, the oscillator 174 includes a NAND circuit 242 receiving the reset signal ZPOR, even stages of serially connected invertors 224 to 250 receiving an output of the NAND circuit 242, and an invertor 252 receiving and inverting an output of the invertor 250 for outputting the reference clock CLK. The output of the invertor 250 is fed back as an input signal for the NAND circuit 242.

Due to this structure, the oscillator 174 stops oscillation when the reset signal ZPOR is at a low level, while the same oscillates when the reset signal ZPOR changes from the low level to a high level for generating the reference clock CLK. In this circuit, the NAND circuit 242 further inverts the output from the even stages of invertors 244 to 250, whereby each node oscillates while repeating logic inversion.

The number of the even stages of invertors 244 to 250 is adjusted at need.

Figure 12:
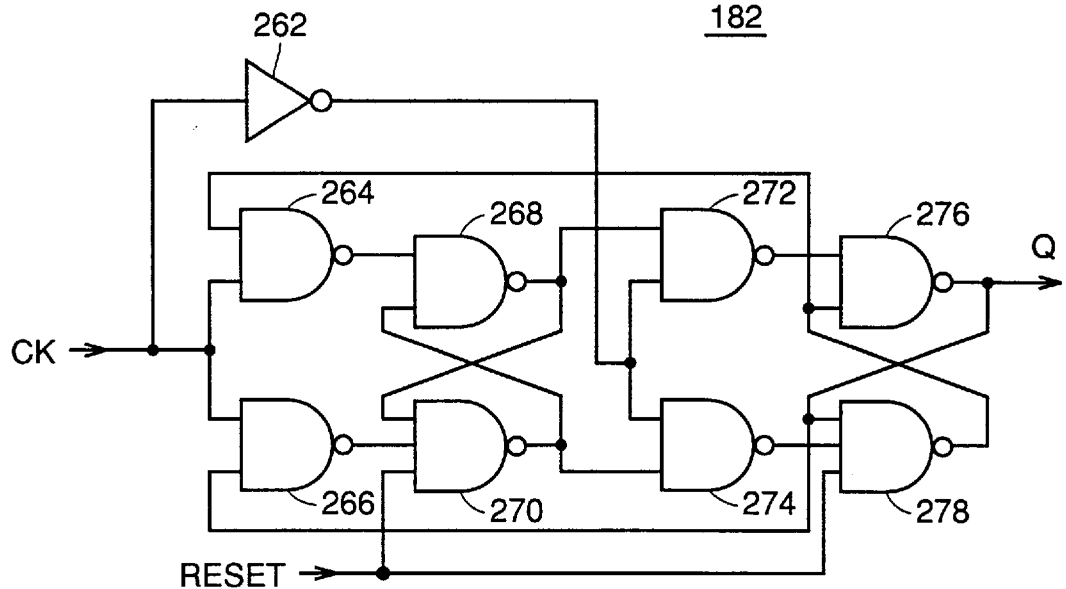
FIG. 12 is a circuit diagram showing the structure of a T-FF 182 appearing in FIG. 7 in detail.

FIG. 12 is a circuit diagram showing the structure of the T-FF 182 appearing in FIG. 7.

Referring to FIG. 12, the T-FF 182 includes NAND circuits 264 and 266 receiving an input signal CK, an invertor 262 receiving and inverting the input signal CK, a NAND circuit 270 receiving an output of the NAND circuit 266 and a reset signal RESET, and a NAND circuit 268 receiving outputs of the NAND circuits 264 and 270. An output of the NAND circuit 268 is fed back to an input of the NAND circuit 270. The T-FF 182 further includes a NAND circuit 272 receiving outputs of the invertor 262 and the NAND circuit 268, a NAND circuit 274 receiving the outputs of the invertor 262 and the NAND circuit 270, a NAND circuit 278 receiving the reset signal RESET and an output of the NAND circuit 274, and a NAND circuit 276 receiving outputs of the NAND circuits 272 and 278. An output signal Q from the NAND circuit 276 is fed back to inputs of the NAND circuits 266 and 278. The output of the NAND circuit 278 is fed back to an input of the NAND circuit 264.

Figure 13:
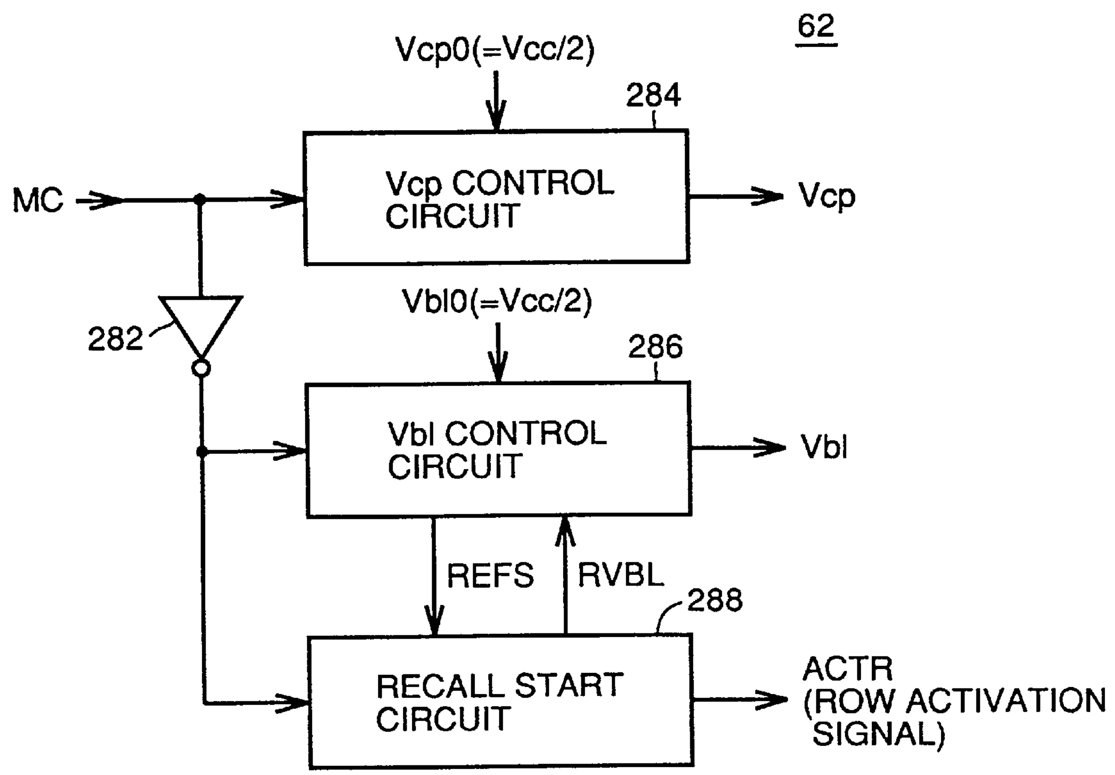
FIG. 13 is a block diagram showing the structure of a DRAM/nonvolatile mode switching circuit 62 appearing in FIG. 4.

FIG. 13 is a block diagram showing the DRAM/nonvolatile mode switching circuit 62 appearing in FIG. 4 in detail.

A structure for controlling the switching operation between the DRAM and nonvolatile modes and its operation are now described.

The DRAM/nonvolatile mode switching circuit 62 includes a Vcp control circuit 284 receiving the mode switching signal MC and the cell plate potential Vcp0 and generating the cell plate potential Vcp, an invertor 282 receiving and inverting the mode switching signal MC, a Vb1 control circuit 286 receiving an output of the invertor 282 and the bit line precharge potential Vb10, and a recall start circuit 288 receiving the output of the invertor 282 and a signal REFS outputted from the Vb1 control circuit 286.

The recall start circuit 288 outputs a signal RVBL to the Vb1 control circuit 286, while outputting the row activation signal ACTR as an output signal. The Vb1 control circuit 286 supplies the bit line precharge potential Vb1.

Figure 14:
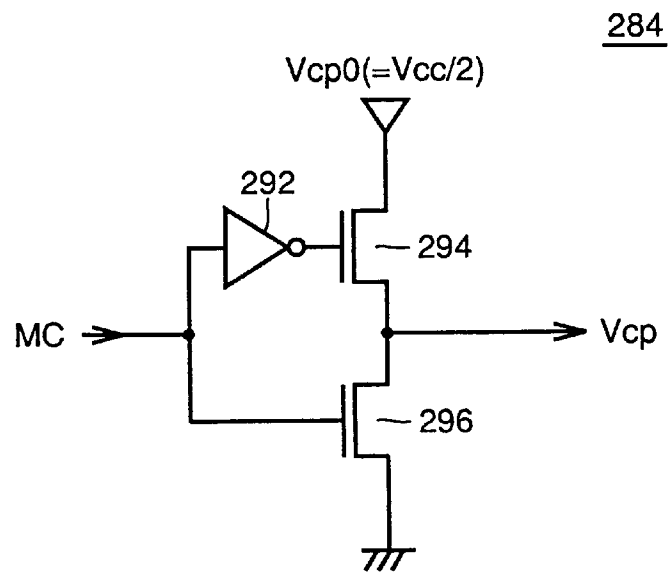
FIG. 14 is a circuit diagram showing the structure of a Vcp control circuit 284 appearing in FIG. 13.

FIG. 14 is a circuit diagram showing the Vcp control circuit 284 appearing in FIG. 13 in detail.

Referring to FIG. 14, the Vcp control circuit 284 includes an invertor 292 receiving the mode switching signal MC, an N-channel transistor 294 receiving an output of the invertor 292 in its gate for coupling the cell plate potentials Vcp0 and Vcp with each other, and an N-channel transistor 296 receiving the mode switching signal MC in its gate for coupling the cell plate potential Vcp with the ground potential.

The Vcp control circuit 284 supplies the ground potential to the cell plate potential Vcp of the block B11 when the mode switching signal MC is at a high level, and supplies the cell plate potential Vcp0 to the cell plate potential Vcp when the mode switching signal MC is at a low level. Referring to FIG. 14, the cell plate potential Vcp0 is Vcc/2, i.e., half the internal power supply potential Vcc.

Figure 15:
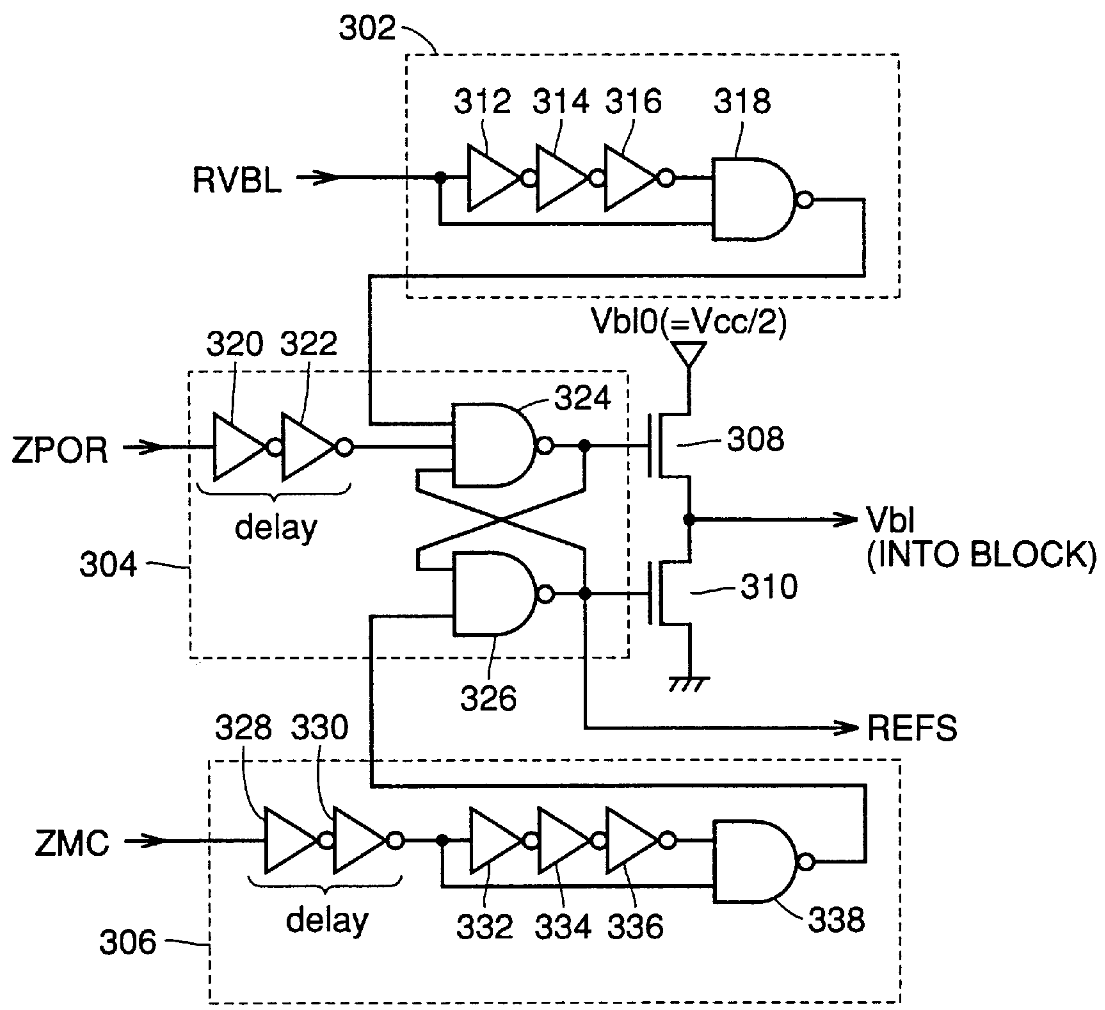
FIG. 15 is a circuit diagram showing the structure of a Vb1 control circuit 286 appearing in FIG. 13 in detail.

FIG. 15 is a circuit diagram showing the Vb1 control circuit 286 appearing in FIG. 13 in detail.

Referring to FIG. 15, the Vb1 control circuit 286 includes a rise detection circuit 306 detecting conversion of a signal ZMC, which is the inverted signal of the mode switching signal MC, from a low level to a high level, a rise detection circuit 302 detecting conversion of the signal RVBL from a low level to a high level, a state hold circuit 304 which is preset by the reset signal ZPOR, set by an output of the rise detection circuit 302 and reset by an output of the rise detection circuit 306, and N-channel MOS transistors 308 and 310 receiving an output of the state hold circuit 304 for deciding the level of the bit line precharge potential Vb1.

The rise detection circuit 306 includes serially connected invertors 328 and 330 receiving the signal ZMC, serially connected invertors 332, 334 and 336 receiving an output of the invertor 330, and a NAND circuit 338 receiving outputs of the invertors 330 and 336.

The rise detection circuit 302 includes serially connected invertors 312, 314 and 316 receiving the signal RVBL, and a NAND circuit 318 receiving the signal RVBL and an output of the invertor 316. The state hold circuit 304 includes serially connected invertors 320 and 322 receiving the reset signal ZPOR, a NAND circuit 324 receiving outputs of the rise detection circuit 302 and the invertor 322, and a NAND circuit 326 receiving outputs of the rise detection circuit 306 and the NAND circuit 324. An output of the NAND circuit 326 is fed back to an input of the NAND circuit 324 and outputted to the exterior of the Vb1 control circuit 286 as the signal REFS. The N-channel transistor 308 receives the output of the NAND circuit 324 in its gate, and couples the bit line precharge potentials Vb10 and Vb1 with each other. The N-channel transistor 310 receives the signal REFS in its gate, and conducts to let the bit line precharge potential Vb1 become the ground potential.

The signal REFS is employed for activating the recall start circuit 288 as hereafter described.

Figure 16:
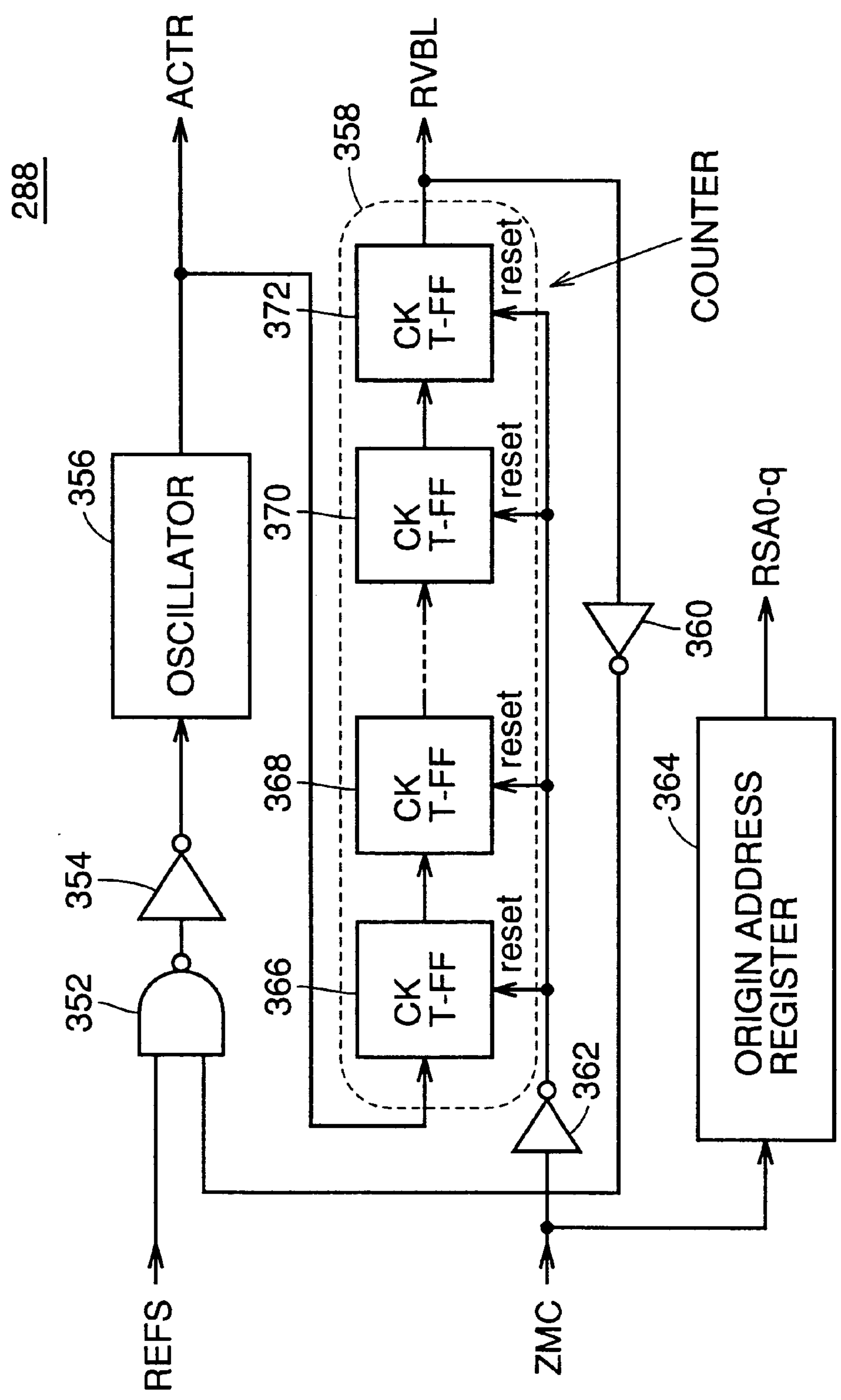
FIG. 16 is a circuit diagram showing the structure of a recall start circuit 288 appearing in FIG. 13 in detail.

FIG. 16 is a circuit diagram showing the structure of the recall start circuit 288 appearing in FIG. 13 in detail.

Referring to FIG. 16, the recall start circuit 288 includes a NAND circuit 352 receiving the signal REFS outputted from the Vb1 control circuit 286, an invertor 354 receiving and inverting an output of the NAND circuit 352, an oscillator 356 which is activated by receiving an output of the invertor 354 for generating the row activation signal ACTR, a counter circuit 358 counting the row activation signal ACTR, an invertor 360 receiving and inverting the output signal RVBL from the counter circuit 358 and feeding back the inverted signal to the NAND circuit 352, an invertor 362 further inverting the inverted mode switching signal ZMC, and an origin address register 364 outputting the address RSA0-q corresponding to the word line forming the origin of the block B11 in response to conversion of the inverted signal ZMC of the mode switching signal MC.

The oscillator 356, which generates the row activation signal ACTR in a proper cycle, is prepared by adjusting the invertor size or the stage number of the oscillator 174 described with reference to FIG. 11, for example.

The counter circuit 358 includes a T-FF 366 receiving the row activation signal ACTR as an input, a T-FF 368 receiving an output of the T-FF 366 as an input, a T-FF 370 receiving an output of the T-FF 368 as an input, and a T-FF 372 receiving an output of the T-FF 370 as an input. The T-FFs 366 to 372 are reset when the output of the invertor 362 is at a low level. The number of the T-FFs 366 to 372 included in the counter circuit 358 is increased/decreased in response to the number of the word lines included in the memory block B11.

The T-FFs 366 to 372 are similar in structure to the T-FF 182 shown in FIG. 12.

Figure 17:
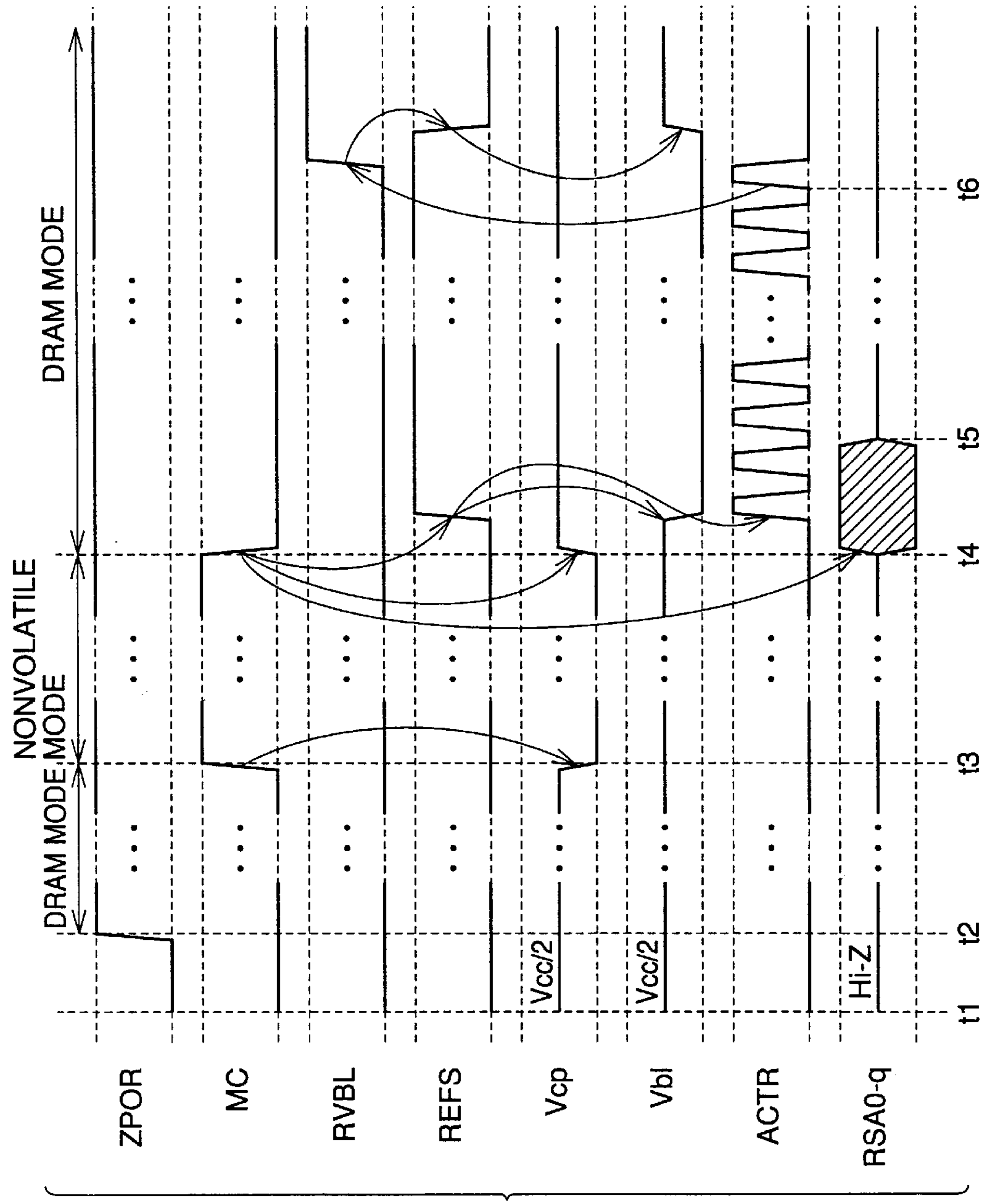
FIG. 17 is an operating waveform diagram illustrating the operation of the DRAM/nonvolatile mode switching circuit 62 shown in FIG. 13.

FIG. 17 is an operating waveform diagram for illustrating the operation of a circuit corresponding to the block B11 shown in FIG. 4. Referring to FIGS. 4, 7, 9 and 11 to 16, power is supplied at a time t1. At this time, the reset signal ZPOR goes low for resetting the respective signals.

At a time t2, a time decided in the POR control circuit 172 elapses and the reset signal ZPOR is released from the low level to a high level. The block B11 starts its operation in the DRAM mode. No access is made from the exterior for the prescribed waiting time Tna, and hence the timer circuit 58 switches the mode switching signal MC from a low level to a high level at a time t3. In response to this change of the mode switching signal MC, the Vcp control circuit 284 switches the cell plate potential Vcp from Vcc/2 to the ground potential. The block B11 enters the nonvolatile mode at this point of time.

The memory block B11 is accessed from the exterior at a time t4, and the timer circuit 58 converts the mode switching signal MC from the high level to a low level in response to this. In case of shifting from the nonvolatile mode to the DRAM mode, the block B11 requires an operation (hereinafter referred to as a recall operation) of converting H/L data in the nonvolatile mode to that in the DRAM mode by a refresh operation with the bit line precharge potential Vb1 at the ground potential, as described later.

At the time t4, the Vcp control circuit 284 converts the cell plate potential Vcp from the ground potential to Vcc/2 in response to the change of the mode switching signal MC. Then, the signal REF rises from a low level to a high level due to the action of the Vb1 control circuit 286, in order to perform the recall operation. In response to this, the bit line precharge potential Vb1 falls from Vcc/2 to the ground potential. In response to the change of the signal REFS, the recall start circuit 288 outputs the row activation signal ACTR by the number of the word lines included in the block B11. At this time, the refresh address RSA0-q is supplied to row control signal generation circuit group 64 between the time t4 and a time t5 in response to the change of the mode switching signal MC, from the origin address register 364.

After outputting the row activation signal ACTR by the number of the word lines included in the block B11, the recall start circuit 288 raises the signal RVBL from the low level to a high level due to the action of the counter circuit 358 provided therein and simultaneously stops outputting the row activation signal ACTR at a time t6. In response to the change of the signal RVBL, the Vb1 control circuit 286 lowers the signal REFS from the high level to a low level and simultaneously converts the bit line precharge potential Vb1 from the ground potential to Vcc/2, so that the block B11 can be thereafter accessed in the DRAM mode.

The operation of the recall start circuit 288 between the times t4 to t6 is further described. The recall operation is the refresh operation with the bit line precharge potential Vb1 at the ground potential. Since it is extremely disadvantageous to have circuits for refreshing the blocks B11 to B18, B21 to B28, B31 to B38 and B41 to B48 independently of each other in consideration of the chip area, and hence the semiconductor memory device 1000 utilizes a row control signal generation circuit group 64 for controlling the timing for activating the word line or the sense amplifier 82 and generating signals necessary for performing a general refresh operation. Namely, the recall start circuit 288 outputs the row activation signal ACTR as if performing the same operation as that when the row control signal generation circuit group 64 is supplied with an instruction (command) for a refresh operation from the exterior. Thus, the row control signal generation circuit group 64 receiving the row activation signal ACTR of a high level performs a series of operations absolutely similarly to the case of receiving an instruction for a refresh operation from the exterior.

Consider CAS before RAS refreshment in a standard DRAM or auto refreshment in a synchronous DRAM as an exemplary refresh operation. A point in common is that only a refresh command is received from the exterior and an internal refresh counter generates a necessary address. Thus, the recall start circuit 288 may supply the row activation signal ACTR by a necessary count (number of the word lines). Therefore, the recall start circuit 288 requires a counter for counting the number of the word lines included in the block B11. In addition, the number of the word lines included in the block B11 forms part of the total number, and hence the address RSA0-q corresponding to the word line forming the origin of the block B11 must be supplied to the refresh counter. Thus, the recall start circuit 288 also includes a register storing the address RSA0-q.

The switching operation from the DRAM mode to the nonvolatile mode at the time t3 is described in further detail. In case of shifting from the DRAM mode to the nonvolatile mode, the cell plate potential Vcp may simply be converted from Vcc/2 to the ground potential. This is clearly understood from the state of the memory cell 72 in the DRAM mode.

Figure 18:
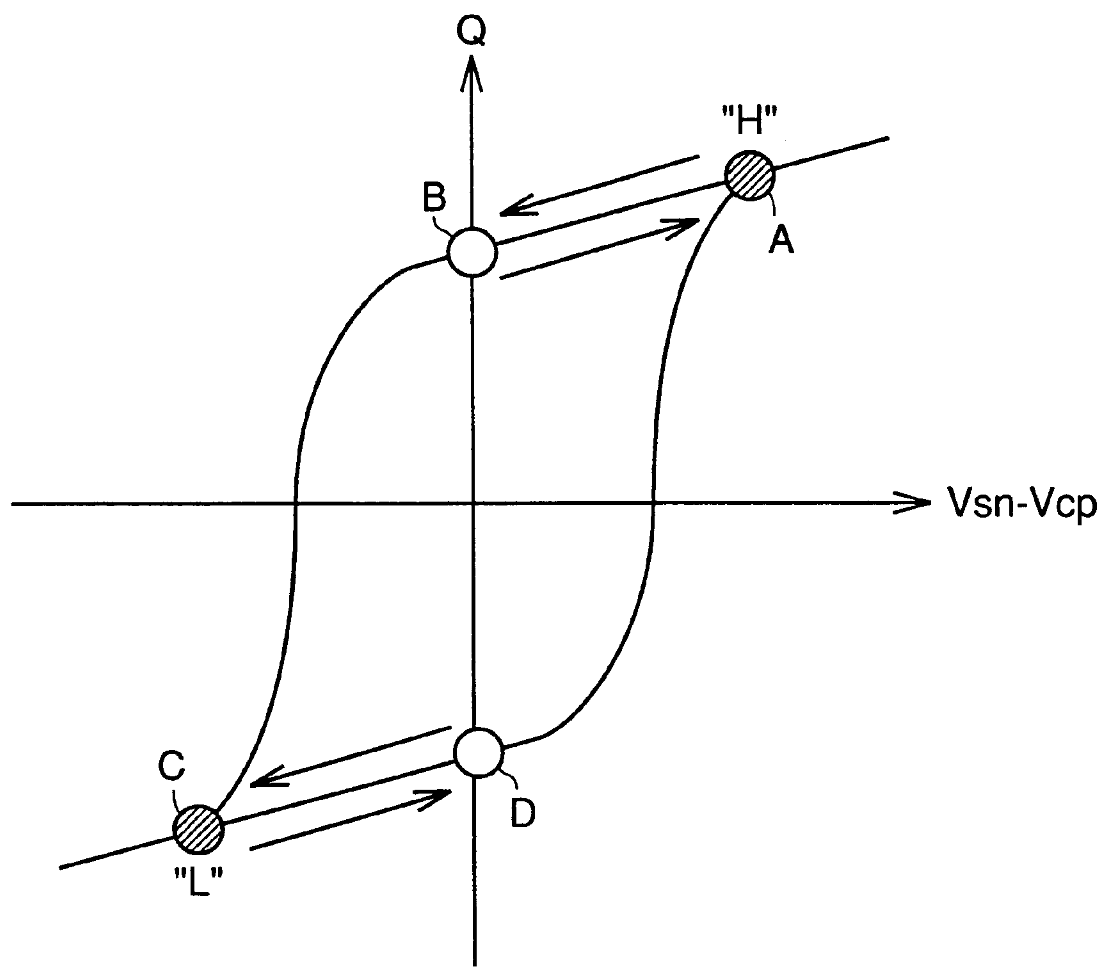
FIG. 18 illustrates polarized states of a ferroelectric capacitor shown in FIG. 5.

FIG. 18 illustrates polarized states of the ferroelectric capacitor 108 employed in the DRAM mode.

Referring to FIG. 18, points A and C show non-accessed states of the memory cell 72 (i.e., the corresponding word lines are at low levels).

The H data gradually shifts to a point B, i.e., a remanent polarization state, due to leakage to a substrate. As hereinabove described, the cell plate potential Vcp is converted from Vcc/2 to the ground potential in case of shifting from the DRAM mode to the nonvolatile mode.

Figure 19:
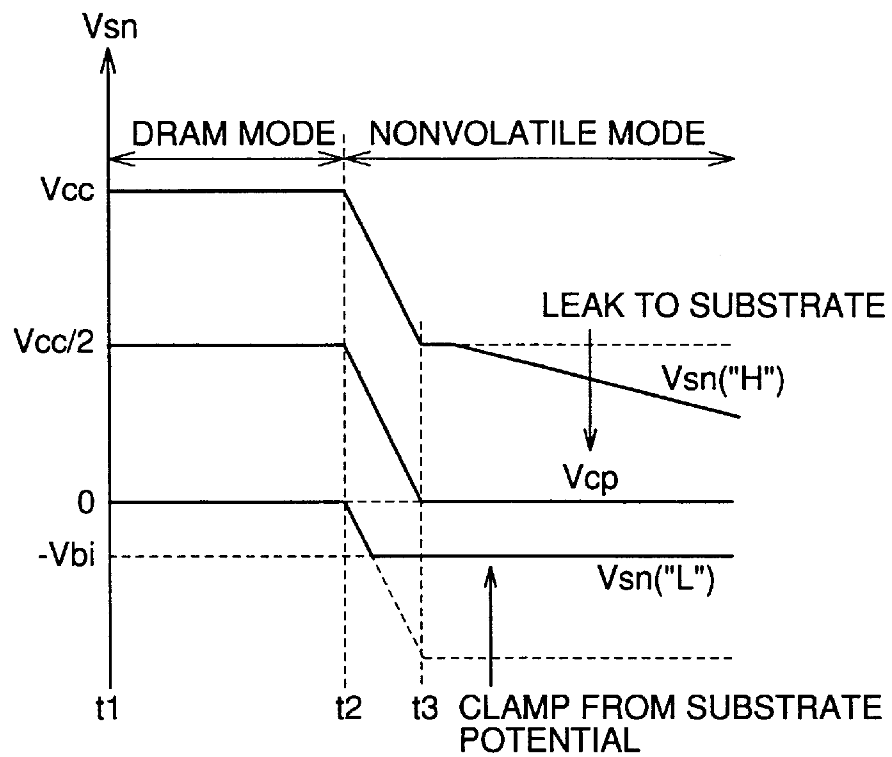
FIG. 19 is an operating waveform diagram illustrating change of a cell plate potential of the ferroelectric capacitor shown in FIG. 5.

FIG. 19 is a waveform diagram showing changes of the cell plate potential Vcp and a storage node potential Vsn in case of switching the mode from the DRAM mode to the nonvolatile mode.

Between times t1 to t2, the memory block B11 operates in the DRAM mode, and the cell plate potential Vcp is Vcc/2. When storing H data, the storage node potential Vsn is at the internal power supply potential Vcc. When storing L data, on the other hand, the storage node potential Vsn is at the ground potential.

Between times t2 and t3, the cell plate potential Vcp is converted from Vcc/2 to the ground potential, in order to switch the mode from the DRAM mode to the nonvolatile mode. Consequently, the storage node potential Vsn is ideally to change substantially by Vcc/2 due to coupling. Namely, the difference Vsn−Vcp between the storage node potential Vsn and the cell plate potential Vcp is to remain substantially identical to that in the DRAM mode for both of the H and L data, thereby keeping the storage information.

In practice, however, the storage node potential Vsn deviates from the ideal state with reference to both H and L data.

When storing the L data, the storage node potential Vsn ideally changes from the ground potential to −Vcc/2 due to coupling, while a P-N junction of the access transistor 106 of the storage node part of the memory cell 72 is forward-biased and charged from the substrate potential Vbb if the value Vcc/2 is lower than the substrate potential Vbb. Consequently, the storage node potential Vsn becomes a level −Vbi clamped from the substrate potential Vbb by the built-in potential of the P-N junction.

Although the potential difference Vsn−Vcp reduces as compared with the ideal value, the direction of an electric field applied to the ferroelectric remains unchanged, and the L data is preserved (polarization is not inverted).

In case of the H data, on the other hand, the storage node potential Vsn changes from Vcc to Vcc/2 due to coupling. Due to presence of a leakage current to the substrate, however, the storage node potential Vsn continuously reduces from Vcc/2 with time. While the storage node potential Vsn finally reaches the ground potential due to the leakage, the direction of the electric field applied to the ferroelectric remains unchanged since the cell plate potential Vcp is at the ground potential. Thus, the H data is held.

It is understood from above that the cell plate potential Vcp may be converted from Vcc/2 to the ground potential in case of shifting from the DRAM mode to the nonvolatile mode.

Figure 20:
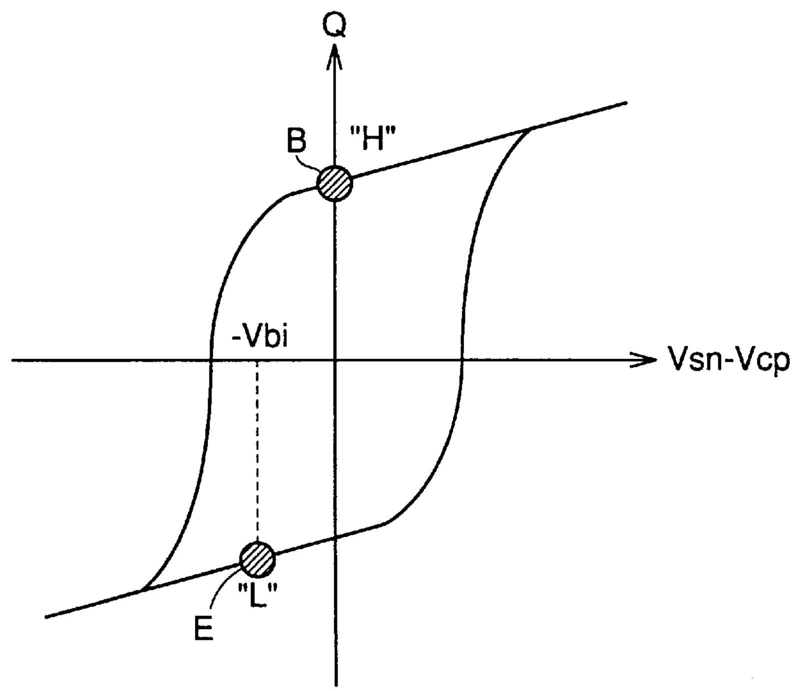
FIG. 20 illustrates polarized states of the ferroelectric capacitor shown in FIG. 5.

FIG. 20 illustrates polarized states of the ferroelectric capacitor 108 of the memory cell 72 after shifting to the nonvolatile mode.

When a sufficient time elapses after shifting to the nonvolatile mode, the memory cell 72 enters a state B if storing H data, or a state E if storing L data.

The shift operation from the nonvolatile mode to the DRAM mode between the times t4 to t6 in FIG. 17 is now described in detail.

In case of shifting from the nonvolatile mode to the DRAM mode, two stages of procedures are required.

The first stage is switching of the cell plate potential Vcp.

Figure 22:
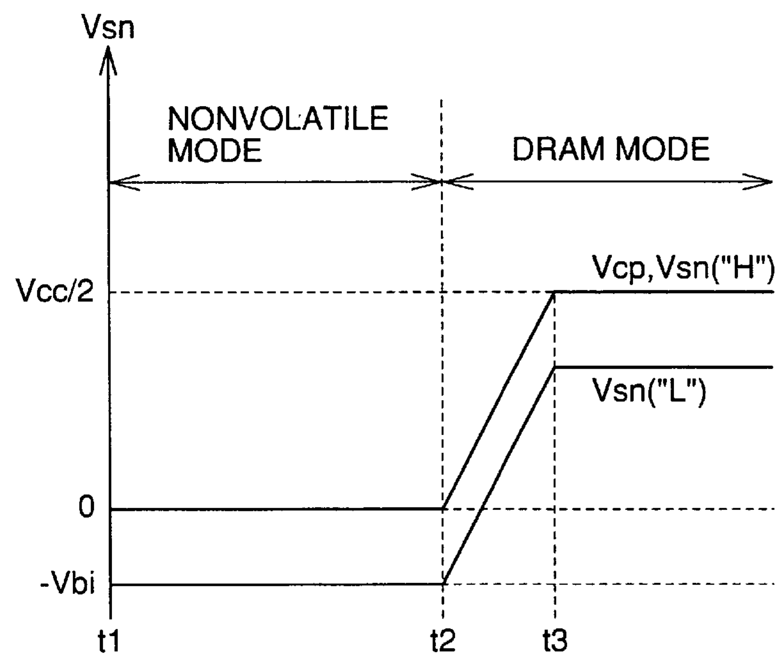
FIG. 22 is an operating waveform diagram illustrating change of the cell plate potential of the ferroelectric capacitor shown in FIG. 5.

FIG. 22 is a waveform diagram showing the switching of the cell plate potential Vcp in case of shifting from the nonvolatile mode to the DRAM mode.

Referring to FIG. 22, the memory block B11 is in the nonvolatile mode and the cell plate potential Vcp is at the ground potential between times t1 and t2. In case of storing the H data, the storage node potential Vsn is at the ground potential, similarly to the cell plate potential Vcp. In case of storing L data, on the other hand, the storage node potential Vsn is at the value −Vbi clamped from the substrate potential Vbb.

The cell plate potential Vcp changes from the ground potential to Vcc/2 between times t2 and t3. The storage node potential Vsn also changes in coupling with the change of the cell plate potential Vcp since the storage node is in a floating state at this time, while the polarized state remains unchanged.

At a time t3, the storage node potential Vsn becomes Vcc/2 when storing H data, while the same reduces by a potential clamped from Vcc/2 when storing L data.

As the second stage, the recall operation is performed by refreshment with the bit line precharge potential Vb1 at the ground potential.

Figure 21:
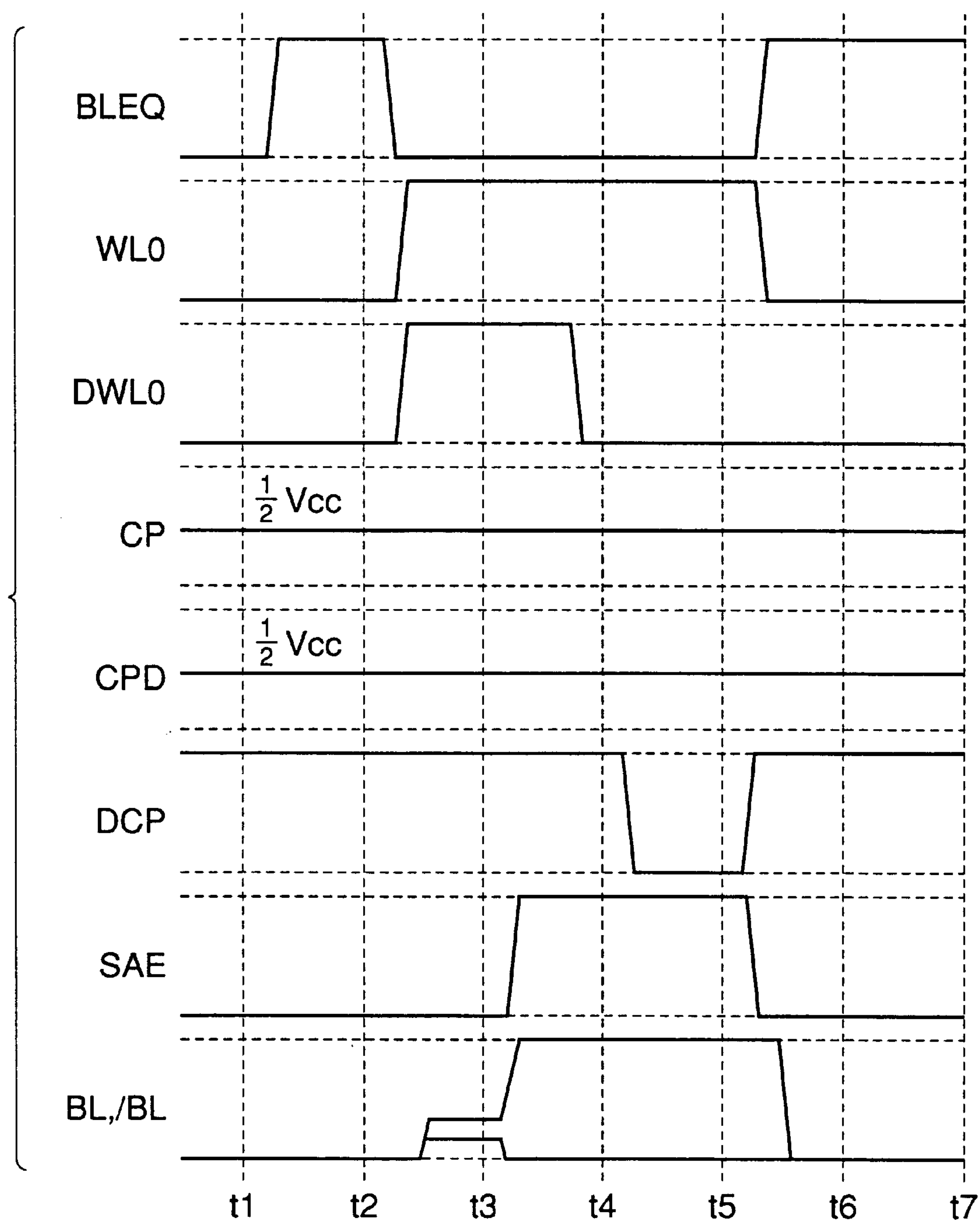
FIG. 21 is an operating waveform diagram illustrating the operation of the memory block shown in FIG. 5.

FIG. 21 is an operating waveform diagram of the recall operation for a single word line.

Referring to FIGS. 5 and 21, the equalize signal BLEQ rises from a low level to a high level between times t1 and t2. At this time, the bit line precharge potential Vb1 is at the ground potential, and hence the potentials of the bit lines BL and /BL reach the ground potential.

Between times t2 and t3, the equalize signal BLEQ first falls from the H level to a low level, so that the word line WL0 and the word line DWL0 for the reference cell 78 are activated. Then, the ferroelectric capacitor 108 is connected to the bit line BL which has been precharged at the ground potential through the access transistor 106, to increase the potential of the bit line BL in response to electric charges which have been held in the ferroelectric capacitor 108.

Similarly, the ferroelectric capacitor 120 of the reference cell 78 is connected to the bit line /BL through the access transistor 118. H data is regularly written in the ferroelectric capacitor 120 as described later, and its capacity is smaller than that of the ferroelectric capacitor 108 provided in the memory cell 72. Immediately after activation of the word line, therefore, the potential of the bit line BL exceeds that of the bit line /BL if the ferroelectric capacitor 108 holds H data or becomes lower than that of the bit line /BL if the ferroelectric capacitor 108 holds L data, while the bit line /BL is regularly at a constant potential.

Between times t3 and t4, the sense amplifier activation signal SAE is converted from a low level to a high level for activating the sense amplifier 82. Small potential difference between the bit lines BL and /BL is amplified to the internal power supply potential Vcc or the ground potential. Then, the potential of the word line DWL0 falls from the high level to a low level so that the ferroelectric capacitor 120 of the reference cell 78 is disconnected from the bit line /BL.

Between times t4 and t5, the reference cell charge signal DCP falls from a high level to a low level, and hence the internal power supply potential Vcc is coupled to a storage node side of the ferroelectric capacitor 120 so that the H data is written therein regardless of the potential of the bit line /BL at the time t4.

Between times t5 and t6, the reference cell charge signal DCP changes from the low level to a high level again, and the storage node of the ferroelectric capacitor 120 is disconnected from the power supply potential Vcc. The potential of the word line WL0 falls from the high level to a low level, so that the ferroelectric capacitor 108 holds data amplified by the sense amplifier 82. Thereafter the sense amplifier activation signal SAE falls from the high level to a low level, and then the equalize signal BLEQ rises from the low level to a high level. In response to this, the potentials of the bit lines BL and /BL go low together.

Figure 23:
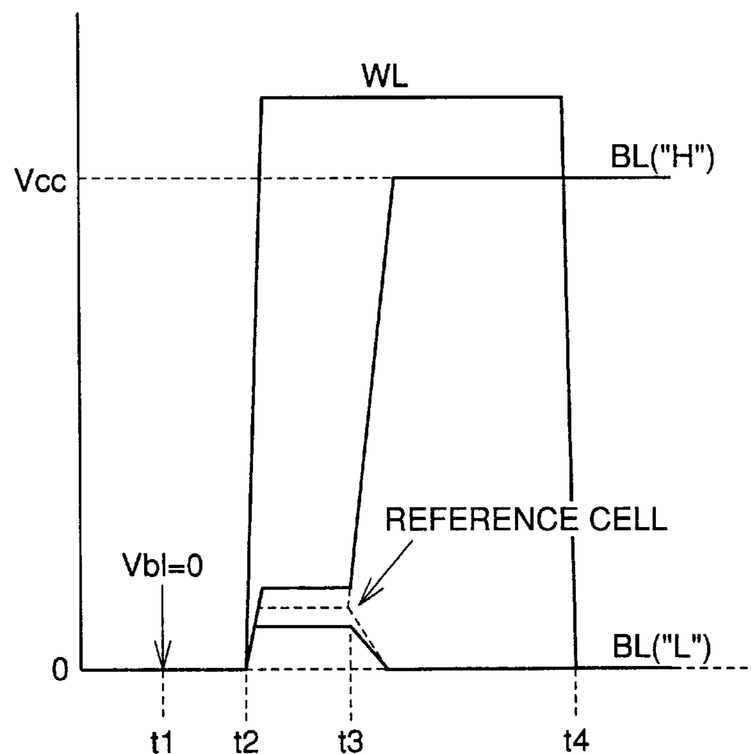
FIG. 23 is an operating waveform diagram illustrating a read operation from the ferroelectric capacitor shown in FIG. 5.

FIG. 23 is a waveform diagram showing potential changes of the bit line BL at the times t2 to t5 in FIG. 21 in detail.

At the time t1, the potential of the bit line BL is at the ground potential, since the bit line precharge potential Vb1 is at the ground potential. The word line WL is activated at the time t2, whereby the potential is increased whether the storage data is H or L data, while this potential rise is slightly higher than the potential rise (shown by a dotted line in FIG. 23) of the reference cell 78 when storing H data, or the former is slightly lower than the latter when storing L data.

The sense amplifier 82 is activated at the time t3, whereby the potential of the bit line BL is amplified to Vcc in case of storing H data since the potential is higher than that of the bit line /BL receiving the potential of the reference cell 78, while the potential of the bit line BL reaches the ground potential if storing the L data.

Figure 24:
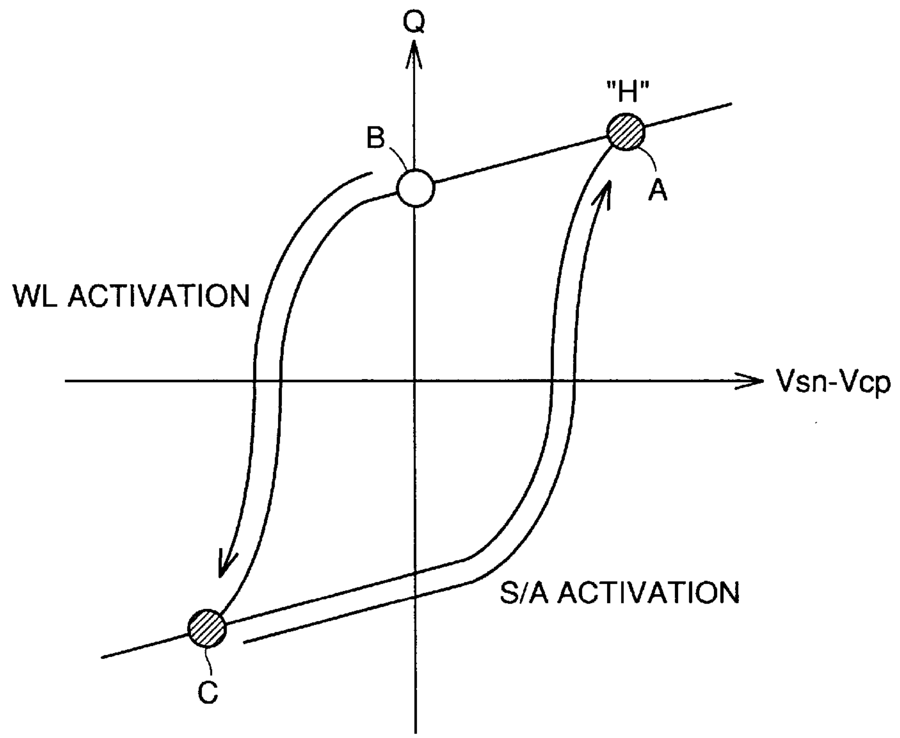
FIG. 24 illustrates polarized states of the ferroelectric capacitor shown in FIG. 5.

FIG. 24 illustrates changes of polarized states of the ferroelectric capacitor 108 in case of storing H data in FIG. 23.

Referring to FIGS. 23 and 24, the ferroelectric capacitor 108 is in a polarized state B in FIG. 24 at a time t1. The word line WL is activated at a time t2, whereby the storage node potential Vsn of the ferroelectric capacitor 108 approaches that of the bit line BL which has been precharged at the ground potential, and the polarized state changes to that at a point C.

The sense amplifier 82 is activated at a time t3, whereby the storage node potential Vsn is raised to Vcc with the bit line potential. At this time, the ferroelectric capacitor 108 is polarized as shown at a point A in FIG. 24. In this state, the sense amplifier 82 rewrites the H data which has been stored as the polarized state in the memory cell 72, to complete the series of operations.

Figure 25:
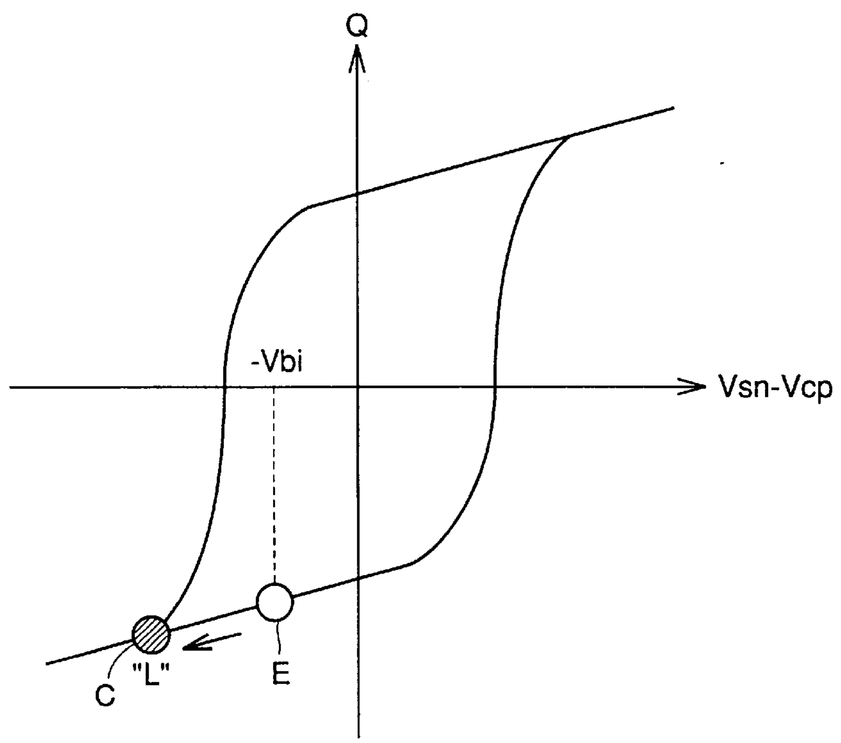
FIG. 25 illustrates polarized states of the ferroelectric capacitor shown in FIG. 5.

FIG. 25 shows changes of the polarized states of the ferroelectric capacitor 108 storing L data in FIG. 23.

Referring to FIGS. 23 and 25, the ferroelectric capacitor 108 is in a polarized state E at a time t1. The word line WL is activated at a time t2 and the sense amplifier 58 is activated at a time t3, whereby the polarized state of the ferroelectric capacitor 108 shifts to that at a point C, to complete the series of operations.

In the semiconductor memory device 1000 according to the embodiment 1 of the present invention, as hereinabove described, the internal timer circuit measures the waiting time Tna for shifting the area not accessed in the DRAM mode to the nonvolatile mode, whereby the semiconductor memory device 1000 hardly depends on the external specification (user state) but can attain a stable effect of low power consumption.

Further, the semiconductor memory device 1000 switches the levels of the cell plate potential Vcp and the bit line precharge potential Vb1 which have been generally employed in the conventional DRAM or ferroelectric memory. Thus, the semiconductor memory device 1000 can follow the conventional operation procedure as such in each mode, and the DRAM and nonvolatile modes can be switched with a simple circuit structure.

Embodiment 2

A semiconductor memory device according to an embodiment 2 of the present invention is different from the semiconductor memory device 1000 according to the embodiment 1 in a point that a timer circuit 1100 corresponding to the timer circuit 58 shown in FIG. 4 is different in internal structure from the circuit shown in FIG. 7.

Figure 26:
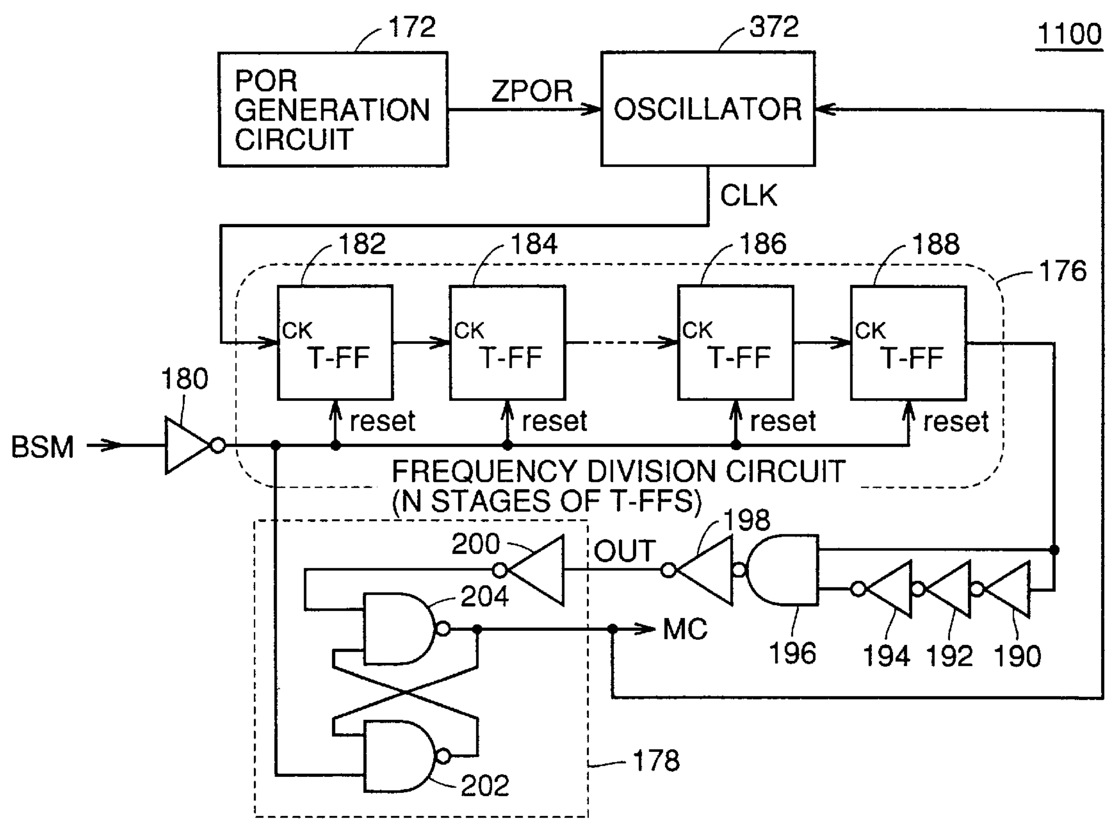
FIG. 26 is a circuit diagram showing the structure of a timer circuit 1100 employed in an embodiment 2 of the present invention in detail.

FIG. 26 is a circuit diagram showing the structure of the timer circuit 1100 employed in the embodiment 2 in place of the timer circuit 58.

The timer circuit 1100 is different from the timer circuit 58 shown in FIG. 7 in a point that the same comprises an oscillator 372 for receiving a mode switching signal MC in place of the oscillator 174.

Figure 27:
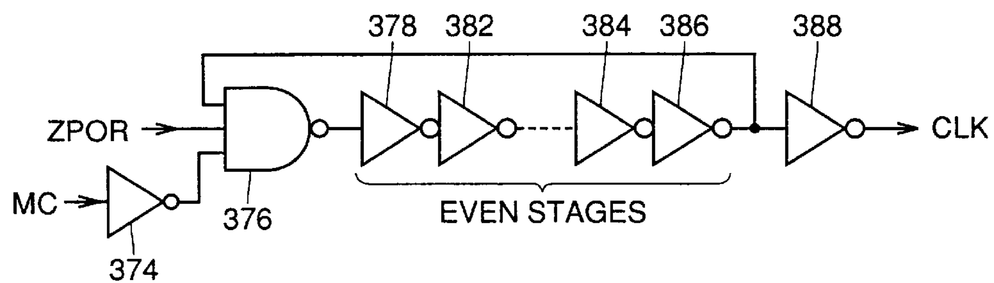
FIG. 27 is a circuit diagram showing the structure of an oscillator 372 appearing in FIG. 26.

FIG. 27 is a circuit diagram showing the structure of the oscillator 372 employed in the timer circuit 1100 shown in FIG. 26.

Referring to FIG. 27, the oscillator 372 includes an invertor 374 receiving the mode switching signal MC, a NAND circuit 376 receiving an output of the invertor 374 and a reset signal ZPOR, even stages of serially connected invertors 378 to 386 receiving an output of the NAND circuit 376, and an invertor 388 receiving an output of the invertor 386 and outputting a reference clock CLK.

The output of the invertor 386 is fed back to an input of the NAND circuit 376.

Figure 28:
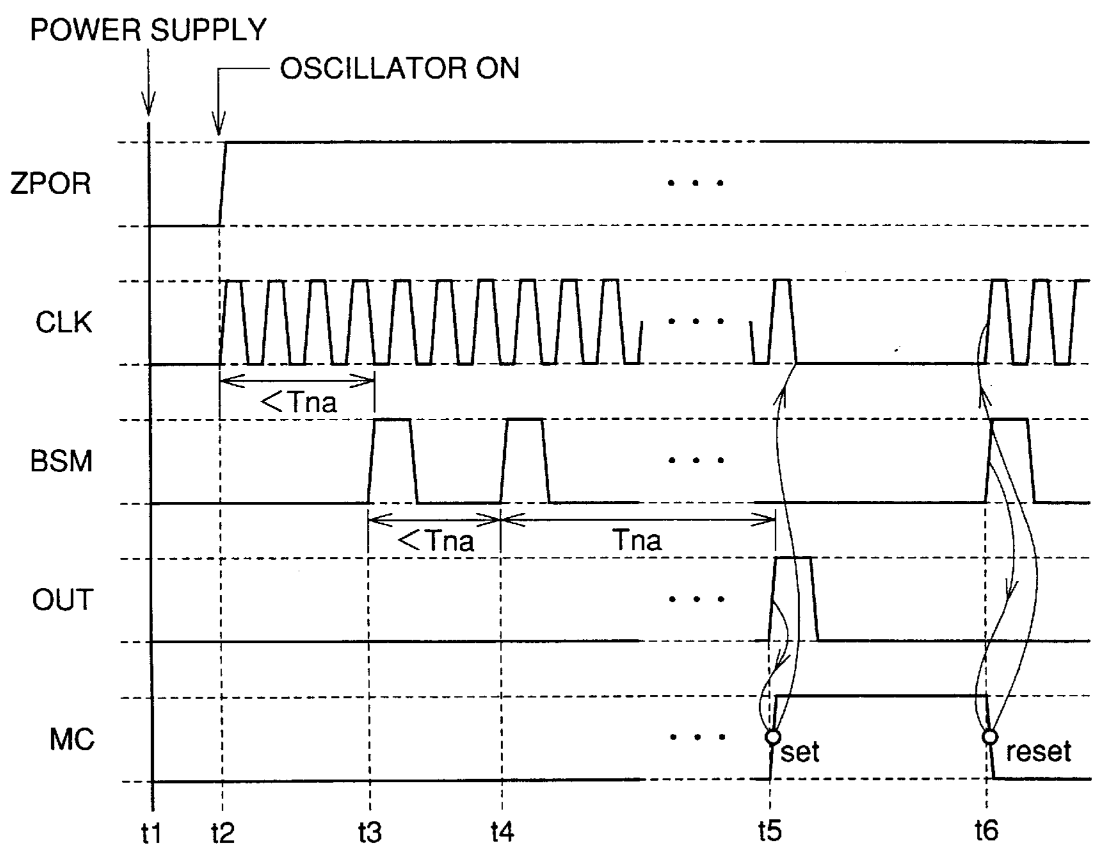
FIG. 28 is an operating waveform diagram illustrating the operation of the timer circuit 1100 shown in FIG. 26.

FIG. 28 is an operating waveform diagram for illustrating the operation of the timer circuit 1100 according to the embodiment 2.

Referring to FIGS. 26, 27 and 28, power is supplied to the semiconductor memory device at a time t1.

At a time t2, the reset signal ZPOR changes from a low level to a high level, and the oscillator 372 is released from resetting. The oscillator 372 outputs the reference clock CLK.

At a time t3, a memory block of the semiconductor memory device is accessed from the exterior, and a pulse occurs on a block selector signal BSM. The period between the reset cancellation up to the pulse formation on the block selector signal BSM is smaller than a set waiting time Tna, and hence the mode switching signal MC remains unchanged.

At a time t4, the memory block is accessed again, and a pulse occurs on the block selector signal BSM. An elapsed time from the access time t3 is smaller than the set waiting time Tna also in this case, and hence the mode switching signal MC still remains unchanged.

At a time t5 after a lapse of the set waiting time Tna from the access time t4, an output of a frequency division circuit 176 is inverted in response to the reference clock CLK inputted by a prescribed pulse number to form a pulse on a signal OUT. A state hold circuit 178 converts the mode switching signal MC from a low level to a high level. The above operation is similar to that of the timer circuit 58 of the semiconductor memory device 1000 according to the embodiment 1.

At the time t5, the mode switching signal MC goes high and one of inputs of the NAND circuit 376 of the oscillator 372 goes low and hence the oscillator 372 enters an inactive state. Therefore, formation of the reference clock CLK is stopped up to a time t6 when the memory block is accessed next.

At the time t6, the memory block is accessed again and a pulse occurs on the block selector signal BSM. In response to this, the state hold circuit 178 of the timer circuit 1100 resets the mode switching signal MC from the high level to a low level. The oscillator 372 starts oscillating again, to form the reference clock CLK.

As hereinabove described, the semiconductor memory device according to the embodiment 2 inactivates the oscillator 372 with the mode switching signal MC in a nonvolatile mode in addition to the effect attained by the semiconductor memory device 1000 described with reference to the embodiment 1, thereby suppressing power consumption in the oscillator 372 in the nonvolatile mode. Consequently, power consumption of the semiconductor memory device is further reduced.

Embodiment 3

A semiconductor memory device according to an embodiment 3 of the present invention is different from the semiconductor memory device 1000 according to the embodiment 1 in a point that an oscillator 1150 provided in a timer circuit is different from the oscillator 174 of the timer circuit 58 according to the embodiment 1 shown in FIG. 11.

Figure 29:
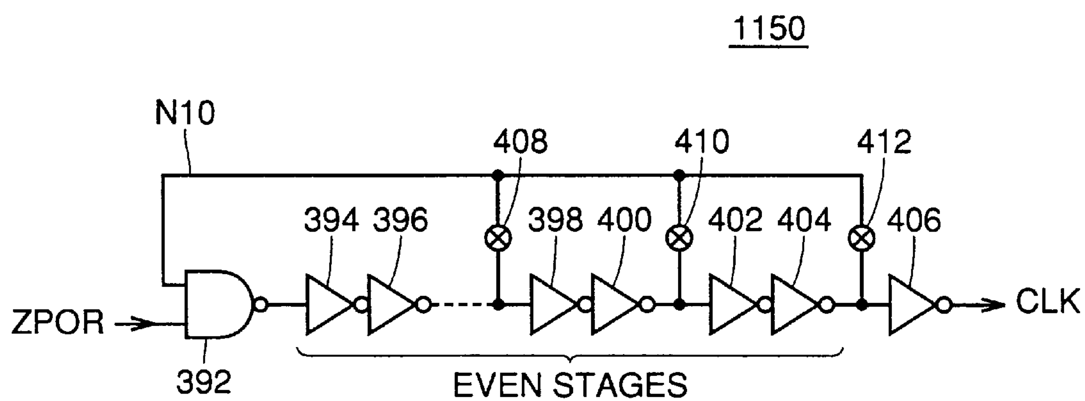
FIG. 29 is a circuit diagram showing the structure of an oscillator 1150 employed in an embodiment 3 of the present invention.

FIG. 29 is a circuit diagram showing the internal structure of the oscillator 1150 employed in the embodiment 3 in place of the oscillator 174.

Referring to FIG. 29, the oscillator 1150 includes a NAND circuit 392 having an input connected with a reset signal ZPOR and a node N10, even stages of serially connected invertors 394 to 404 receiving an output of the NAND circuit 392, and an invertor 406 receiving an output of the invertor 404 and outputting a reference clock CLK.

Outputs of the invertors 396, 400 and 404 are connected with the node N10 through fuses 408, 410 and 412 respectively. In employment, the oscillator 1150 disconnects two of the fuses 408, 410 and 412 except the remaining one.

The stage number of the invertors 394 to 404 is increased/decreased in response to the necessary oscillation cycle, and the number of portions provided with the fuses 408, 410 and 412 is also increased/decreased in response to the range of adjustment.

The oscillator 1150 according to the embodiment 3 can select the stage number of the invertors 394 to 404 included in its loop in response to the position not disconnecting the fuse 408, 410 or 412, whereby a prescribed waiting time Tna for switching a memory block from the DRAM mode to the nonvolatile mode can be adjusted.

Assuming that the cycle of the oscillator 1150 is changed by ΔTc by changing the stage number of the invertors 394 to 404, the change ΔTna of the prescribed waiting time Tna is expressed as follows:

$$\Delta Tna = \Delta Tc \times 2^N \quad (1)$$

where N represents the number of T-FFs included in the timer circuit.

Embodiment 4

A semiconductor memory device according to an embodiment 4 of the present invention is different from the semiconductor memory device 1000 according to the embodiment 1 in a point that an oscillator 1200 provided in a timer circuit is different from the oscillator 174 of the timer circuit 58 shown in FIG. 11.

Figure 30:
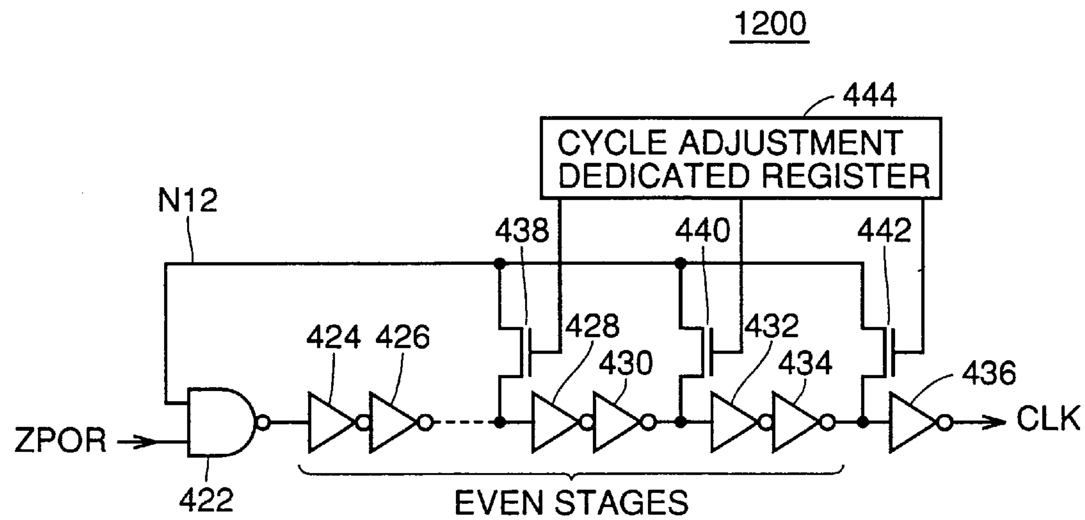
FIG. 30 is a circuit diagram showing the structure of an oscillator 1200 employed in an embodiment 4 of the present invention.

FIG. 30 is a circuit diagram showing the internal structure of the oscillator 1200 employed in the embodiment 4 in place of the oscillator 174.

Referring to FIG. 30, the oscillator 1200 includes a NAND circuit 422 having an input connected with a reset signal ZPOR and a node N12, even stages of serially connected invertors 424 to 434 receiving an output of the NAND circuit 422, an invertor 436 receiving an output of the invertor 434 and outputting a reference clock CLK, transfer gates 438, 440 and 442 connecting outputs of the invertors 426, 430 and 434 to the node N12 respectively, and a cycle adjustment dedicated register 444 controlling opening/closing of the transfer gates 438, 440 and 442.

The oscillator 1200 turns on only one of the transfer gates 438, 440 and 442 in response to the content previously written in the cycle adjustment dedicated register 444, for adjusting the stage number of the invertors 424 to 434.

The stage number of the invertors 424 to 434 is increased/decreased in response to the necessary oscillation cycle, and the number of portions provided with the transfer gates 438, 440 and 442 is also increased/decreased in response to the range of adjustment.

The semiconductor memory device according to the embodiment 4 can also change the stage number of the invertors 424 to 434 included in the loop of the oscillator 1200 similarly to the embodiment 3, whereby a prescribed waiting time Tna can be adjusted.

Embodiment 5

A semiconductor memory device according to an embodiment 5 of the present invention is different from the semiconductor memory device 1000 according to the embodiment 1 in a point that an oscillator 1250 provided in a timer circuit is different from the oscillator 174 of the timer circuit 58 shown in FIG. 11.

Figure 31:
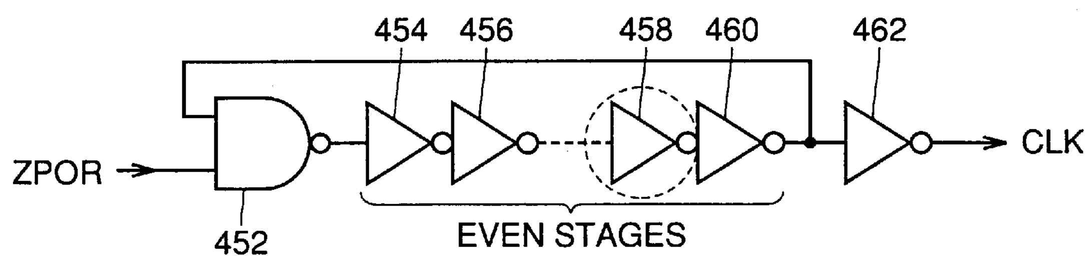
FIG. 31 is a circuit diagram showing the structure of an oscillator 1250 employed in an embodiment 5 of the present invention.

FIG. 31 is a circuit diagram showing the internal structure of the oscillator 1250 employed in the embodiment 5 in place of the oscillator 174.

Referring to FIG. 31, the oscillator 1250 includes a NAND circuit 452 receiving a reset signal ZPOR, even stages of serially connected invertors 454 to 460 receiving an output of the NAND circuit 452, and an invertor 462 receiving an output of the invertor 460 and outputting a reference clock CLK. The output of the invertor 460 is fed back to an input of the NAND circuit 452.

The stage number of the invertors 454 to 460 is increased/decreased in response to the necessary oscillation cycle.

The oscillator 1250 according to the embodiment 5 changes the ratio of the gate width to the gate length in at least one of the even stages of serially connected invertors 454 to 460.

Figure 32:
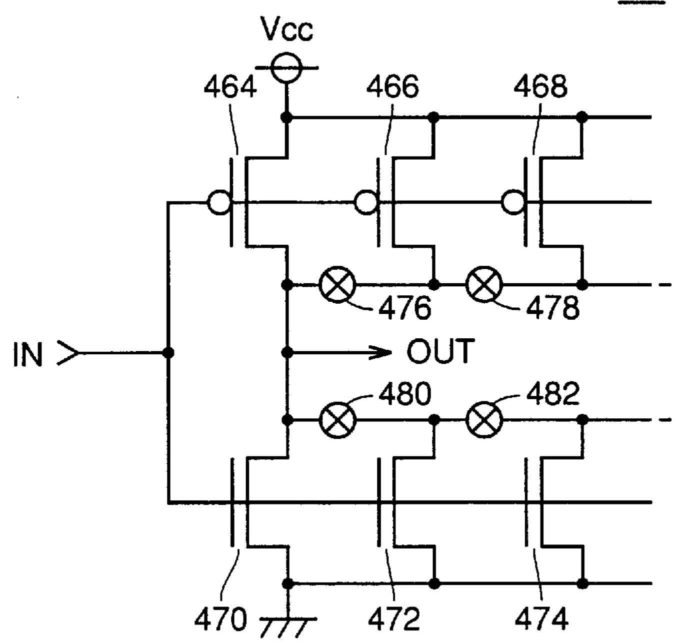
FIG. 32 is a circuit diagram showing the structure of an invertor 458 appearing in FIG. 31 in detail.

FIG. 32 is a circuit diagram showing the invertor 458 included in the oscillator 1250 appearing in FIG. 31 in detail.

Referring to FIG. 32, the invertor 458 includes a P-channel transistor 464 receiving an input signal IN in its gate and coupling a power supply potential Vcc with an output signal OUT, and an N-channel transistor 470 receiving the input signal IN in its gate and coupling the output signal OUT with a ground potential. The invertor 458 further includes P-channel transistors 466 and 468 having gates receiving the input signal IN and sources coupled to the power supply potential Vcc, N-channel transistors 472 and 474 having gates receiving the input signal IN and sources coupled to the ground potential, a switch 476 connecting the drains of the P-channel transistors 464 and 466 with each other, a switch 478 connecting the drains of the P-channel transistors 466 and 468 with each other, a switch 480 connecting the drains of the N-channel transistors 470 and 472 with each other, and a switch 482 connecting the drains of the N-channel transistors 472 and 474 with each other.

The switches 476 to 482 can be relatively readily connected and disconnected by revising aluminum wiring mask patterns in fabrication of the semiconductor memory device, for example.

A rise time Tr or a fall time Tf of each invertor changes if all invertors 454 to 460 are identical in structure to the invertor 458. Assuming that Tc represents the cycle of the oscillator 1250 and α represents the change rate of the transition time of each invertor, the following equation holds:

$$\Delta Tna = |\alpha - 1| \times Tc \times 2^N \quad (2)$$

where N represents the number of T-FFs included in the timer circuit. Thus, a prescribed waiting time Tna can be adjusted more remarkably as compared with the method of increasing/decreasing the stage number of the invertors, and this method is advantageous in consideration of the layout area due to no employment of fuses and a dedicated register.

Embodiment 6

A semiconductor memory device according to an embodiment 6 of the present invention is different from the semiconductor memory device 1000 according to the embodiment 1 in a point that a timer circuit 1300 is different in internal structure from the timer circuit 58 shown in FIG. 7.

Figure 33:
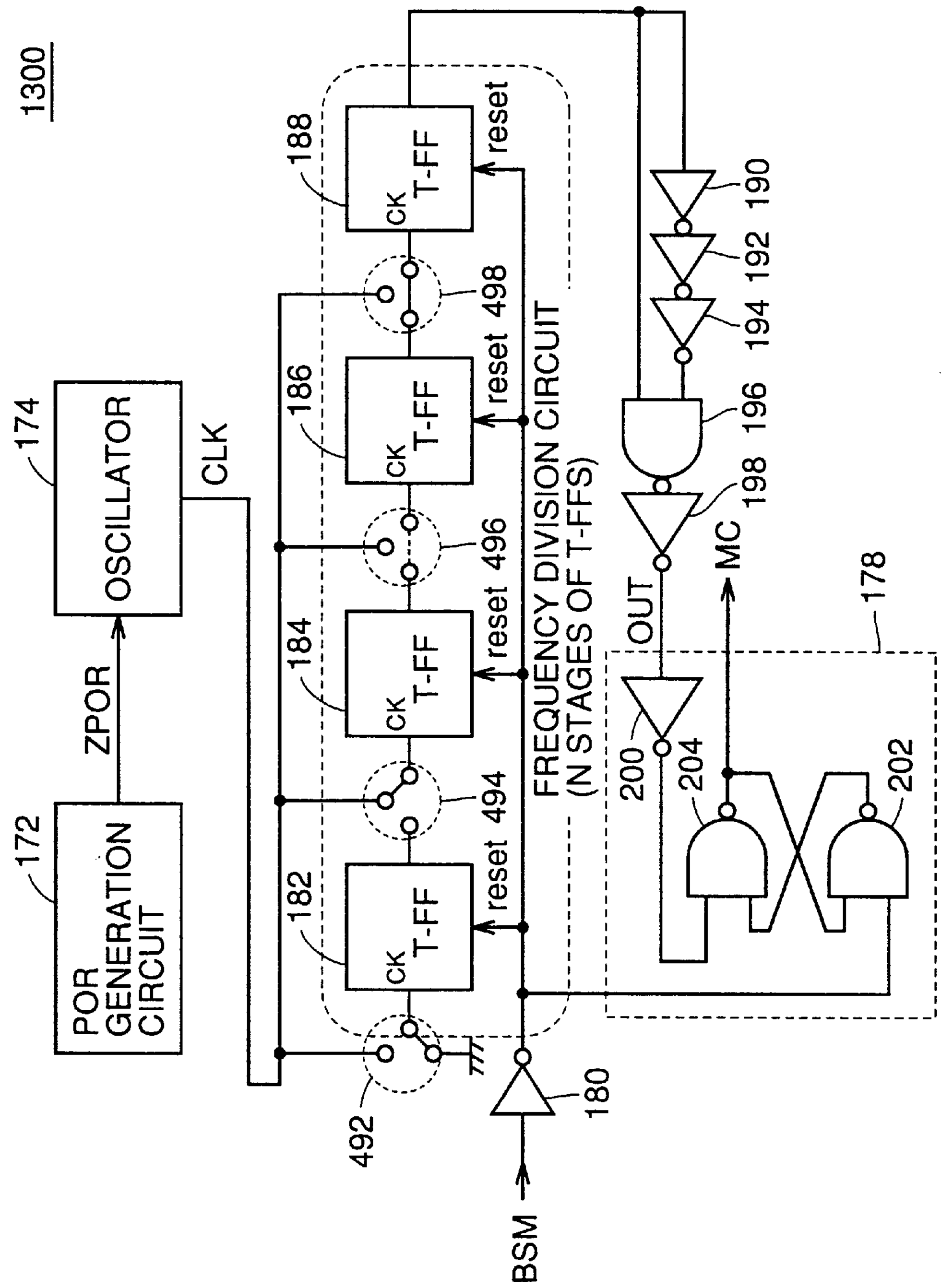
FIG. 33 is a circuit diagram showing the structure of a timer circuit 1300 employed in an embodiment 6 of the present invention in detail.

FIG. 33 is a circuit diagram showing the structure of the timer circuit 1300 employed in the embodiment 6 in place of the timer circuit 58 described with reference to FIG. 7.

Referring to FIG. 33, switches 492, 494, 496 and 498 are provided on input terminals of T-FFs 182, 184, 186 and 188 respectively, to be capable of changing the stage number of the T-FFs 182, 184, 186 and 188 employed in a frequency division circuit. Referring to FIG. 33, the switch 492 couples the input of the T-FF 182 to a ground potential, and the switch 494 inputs a reference clock CLK in the input of the T-FF 184. The switches 496 and 498 are set to transmit outputs of the front stages of T-FFs to the rear stages of T-FFs.

Assuming that dn represents the number of increased/decreased T-FFs in this case, a prescribed waiting time Tna is expressed as follows:

$$Tna=Tna0\times 2^{dn} \quad (3)$$

where Tna0 represents a prescribed waiting time in case of not increasing/decreasing the stage number of the T-FFs. Also in this case, the waiting time Tna can be remarkably adjusted as compared with the case of increasing/decreasing the stage number of the invertors.

Embodiment 7

A semiconductor memory device according to an embodiment 7 of the present invention is different from the semiconductor memory device 1000 according to the embodiment 1 in a point that an oscillator 1350 provided in a timer circuit is different from the oscillator 174 of the timer circuit 58 shown in FIG. 11.

Figure 34:
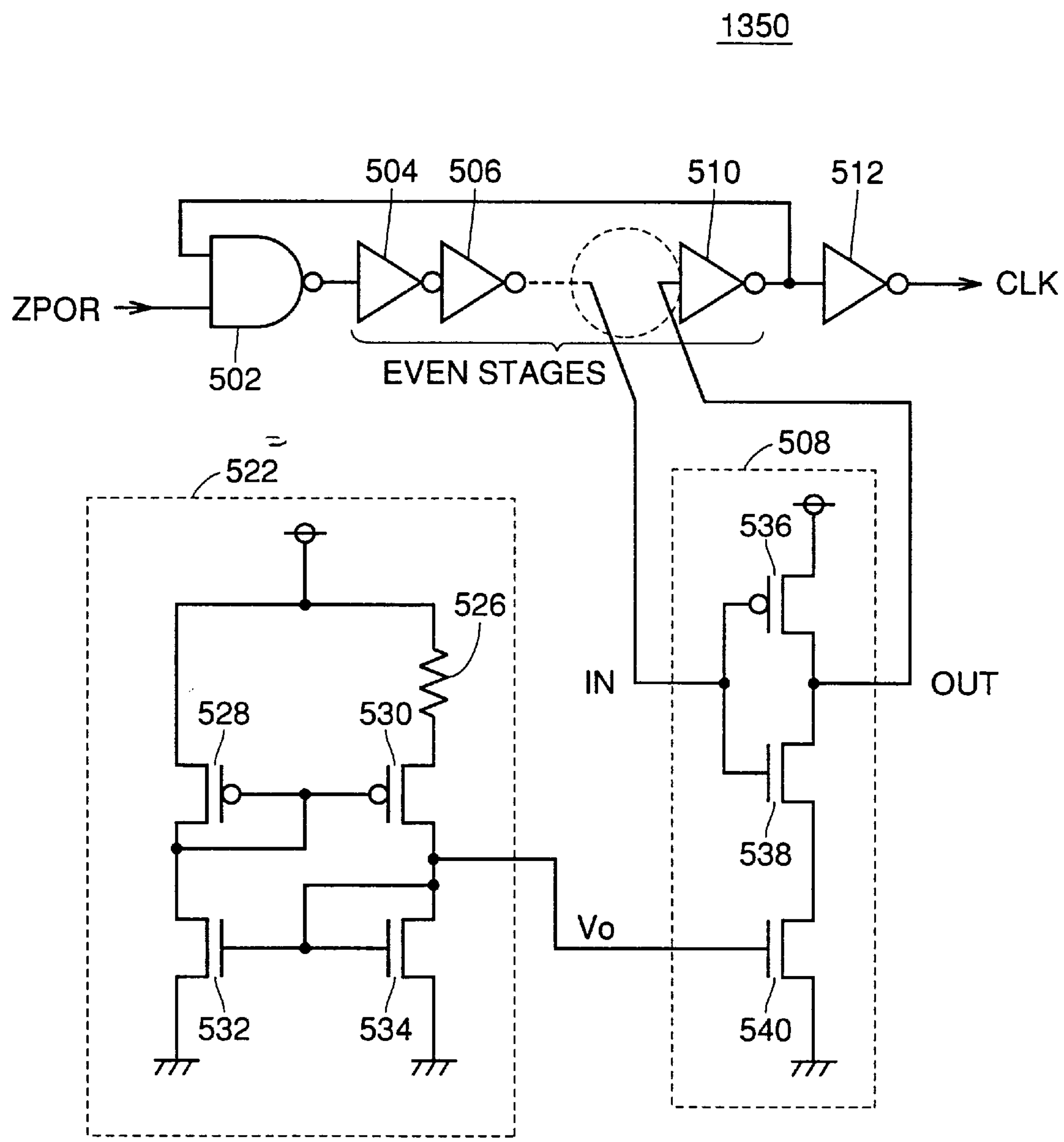
FIG. 34 is a circuit diagram showing the structure of an oscillation circuit 1350 employed in an embodiment 7 of the present invention.
Figure 35:
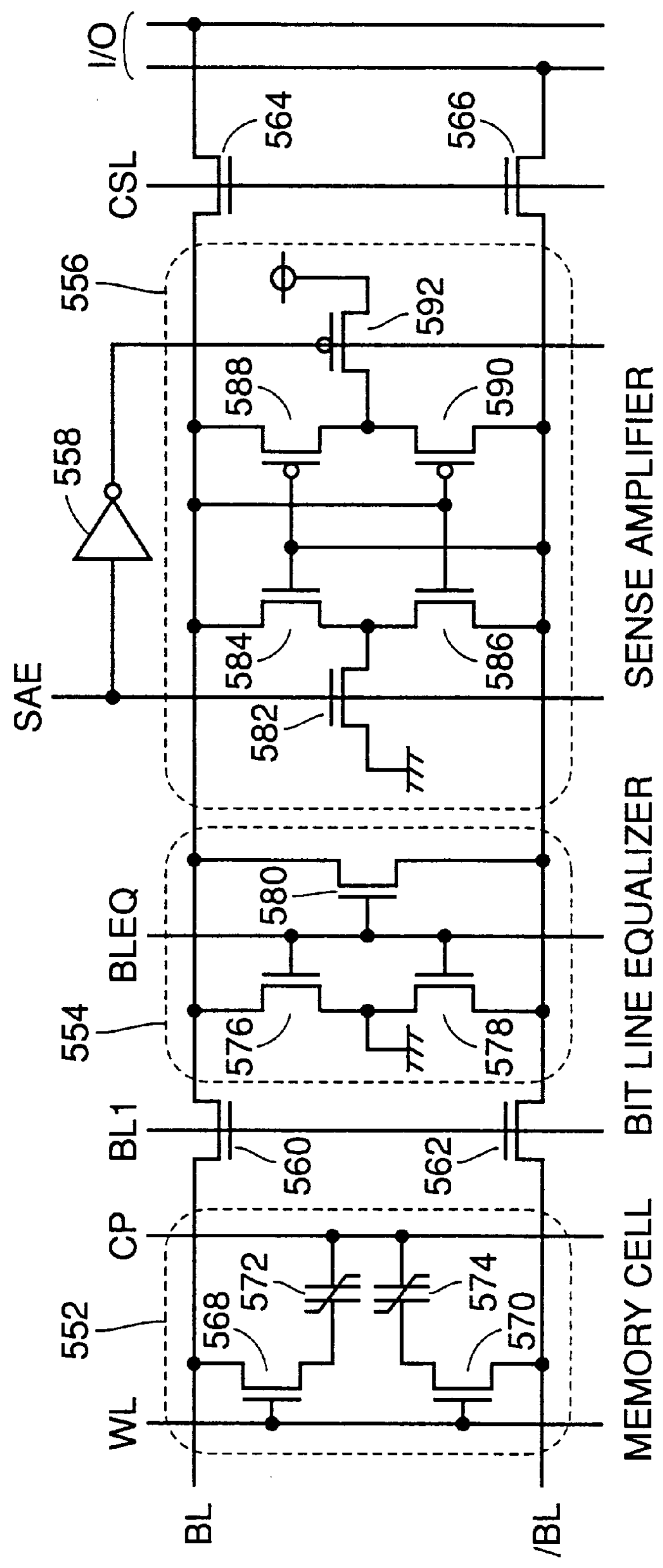
FIG. 35 is a circuit diagram showing the structure of a conventional ferroelectric memory.
Figure 36:
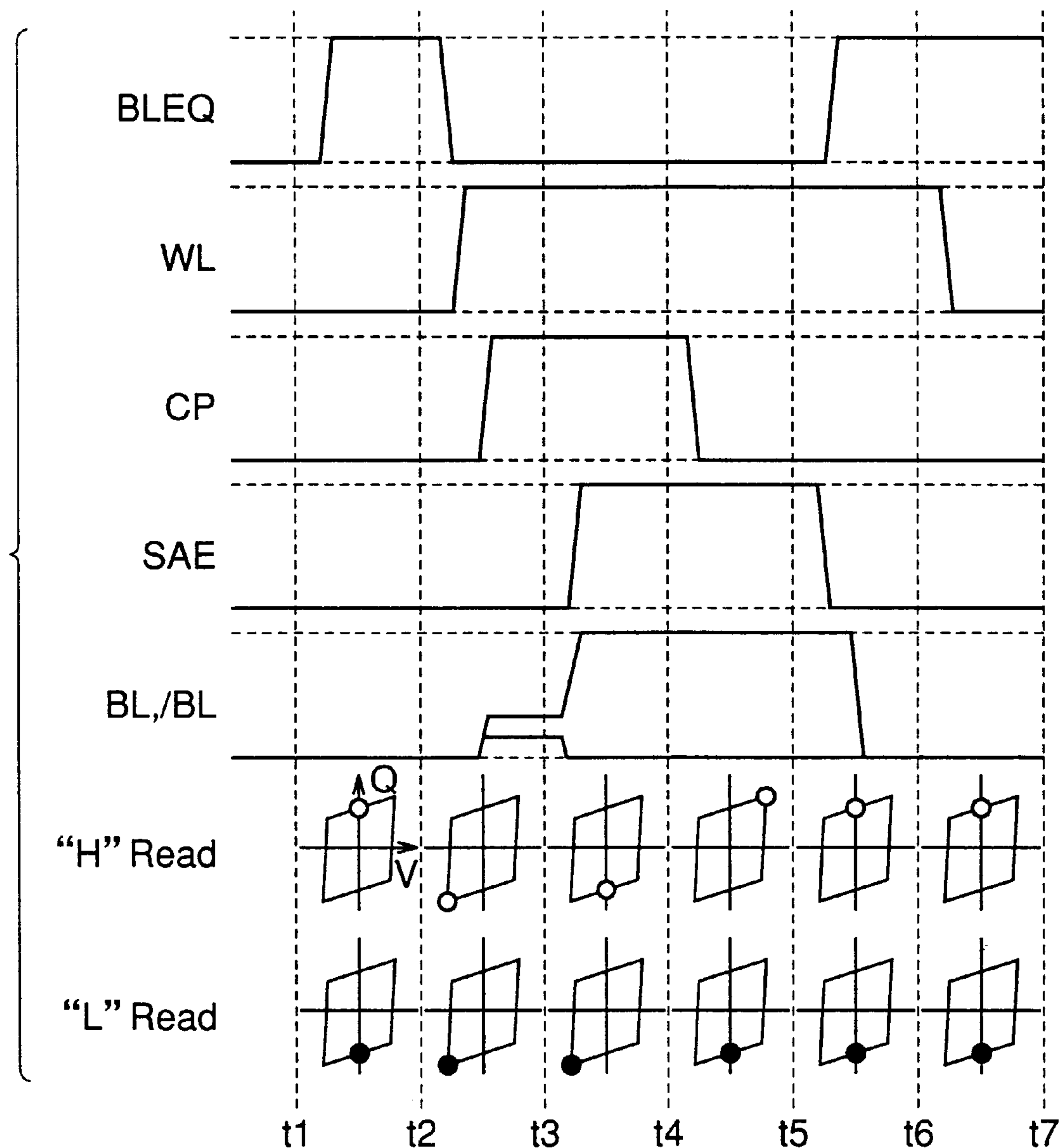
FIG. 36 is an operating waveform diagram illustrating the operation of the ferroelectric memory shown in FIG. 35.
Figure 37:
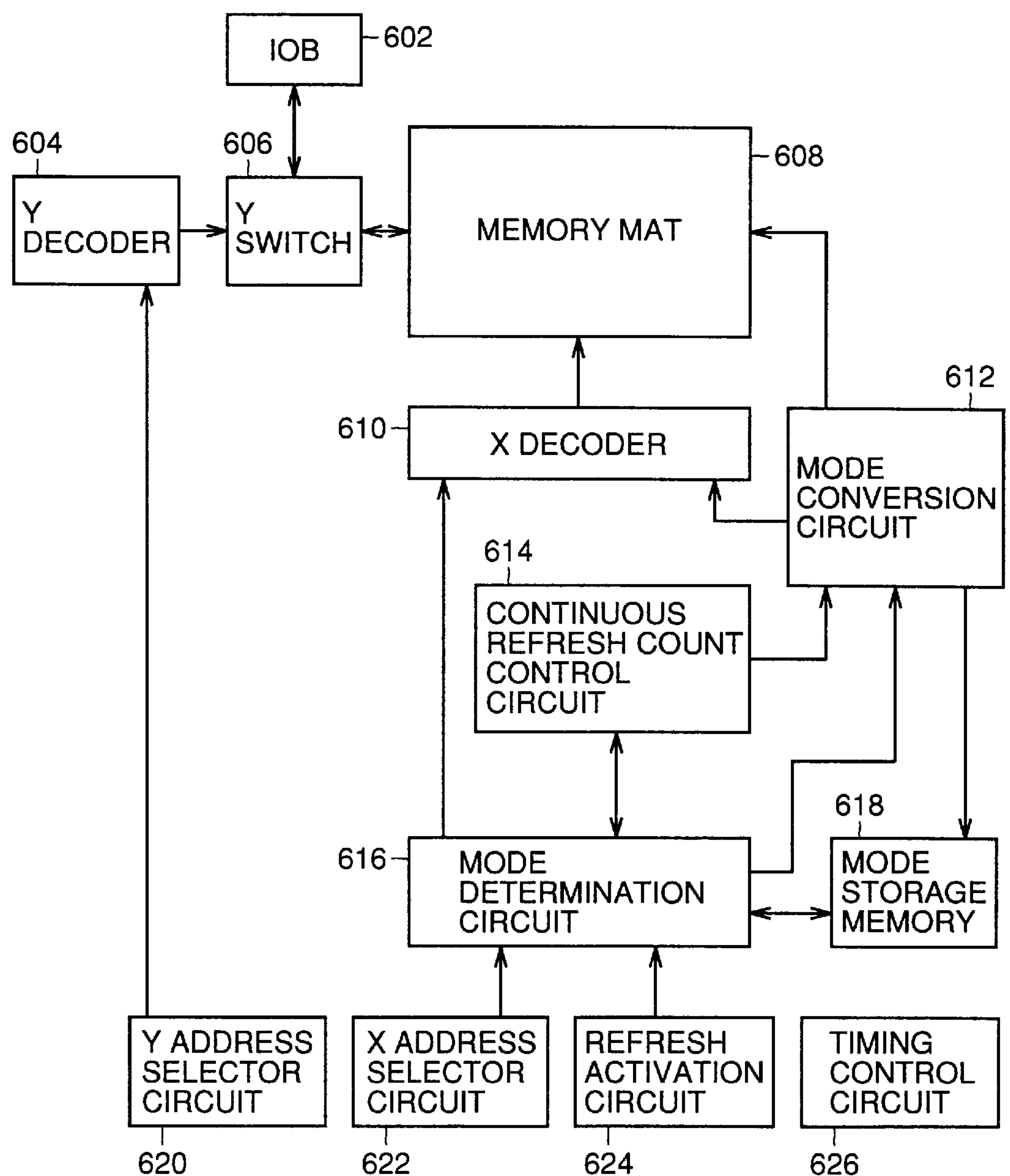
FIG. 37 illustrates the structure of a conventional semiconductor memory device switched between a DRAM mode and a nonvolatile mode.
Figure 38:
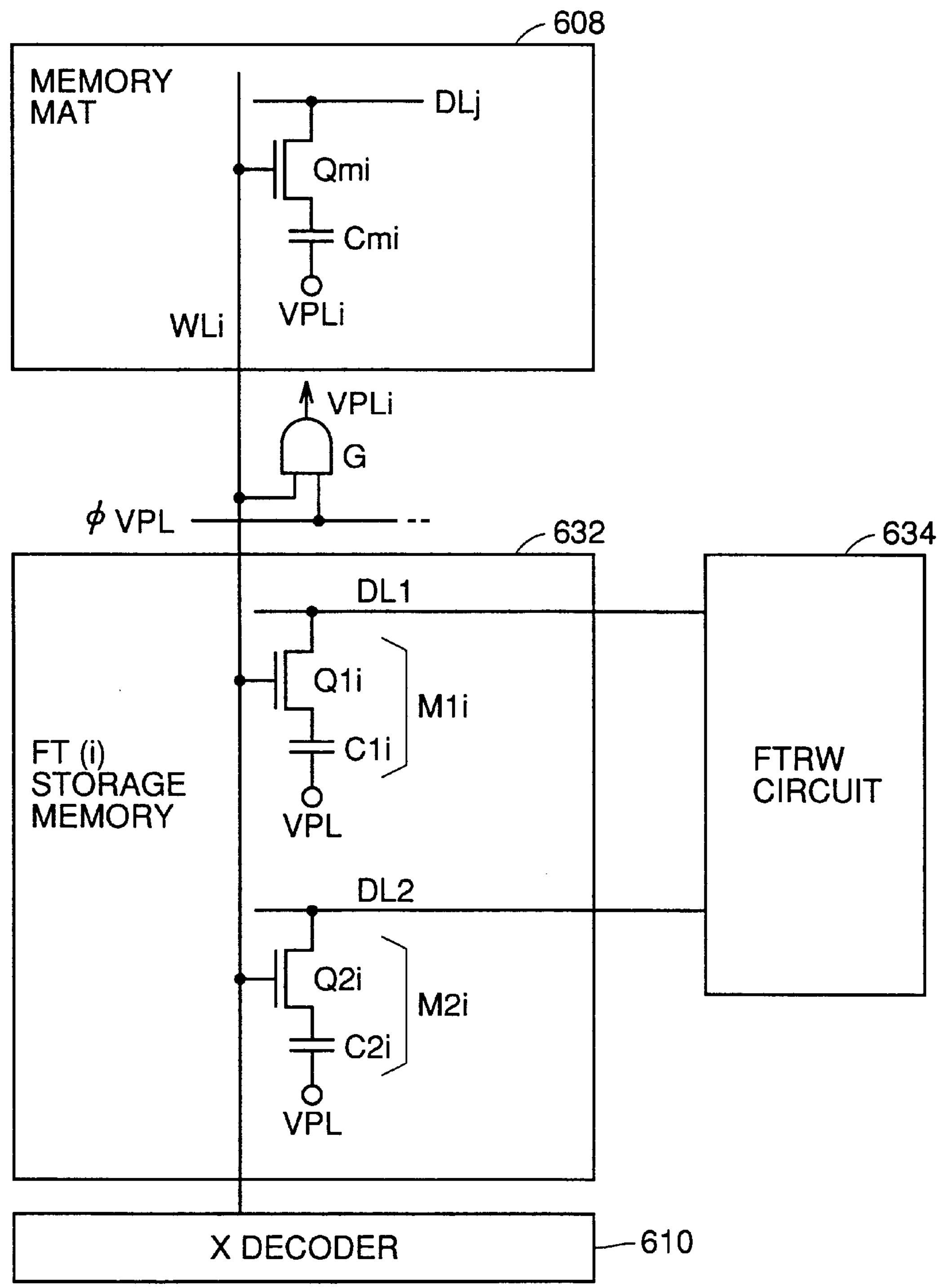
FIG. 38 is a block diagram illustrating the structure of the conventional semiconductor memory device shown in FIG. 37 in detail.
Figure 39:
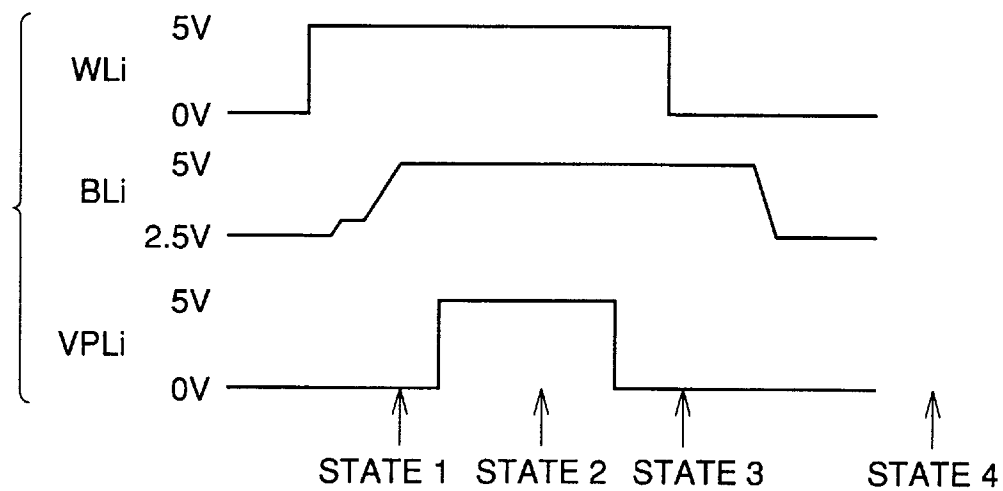
FIG. 39 is an operating waveform diagram illustrating the operation of a conventional ferroelectric memory shown in FIG. 38.
Figure 40:
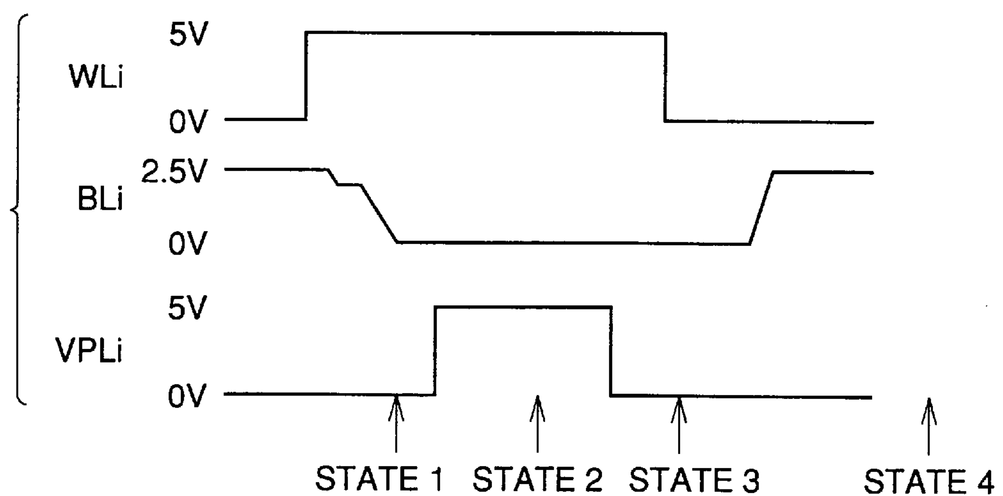
FIG. 40 is an operating waveform diagram illustrating the operation of the conventional ferroelectric memory shown in FIG. 38.
Figure 41B:
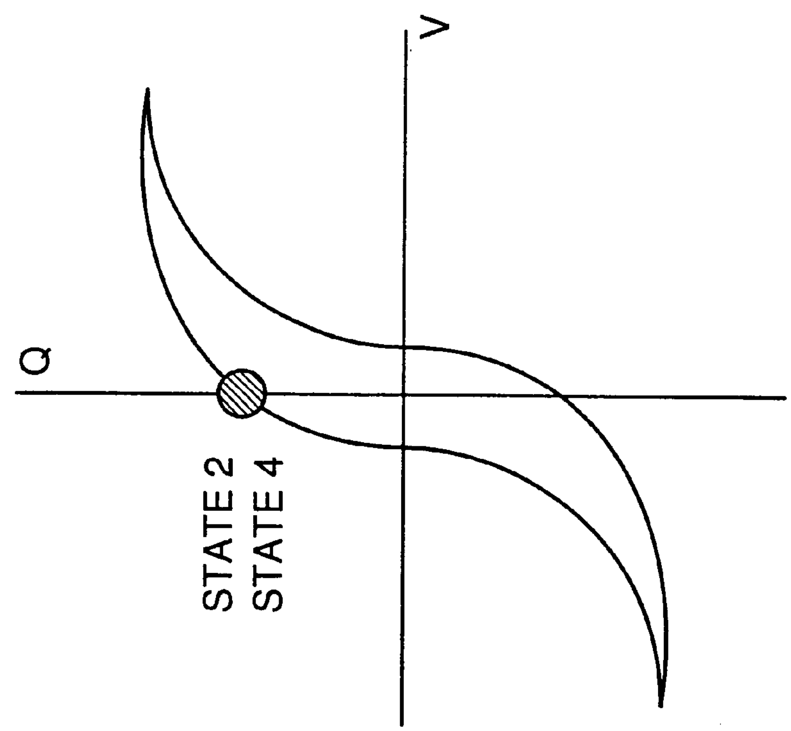
FIG. 41B illustrates polarized states in states 2 and 4 in FIG. 39 respectively.
Figure 41A:
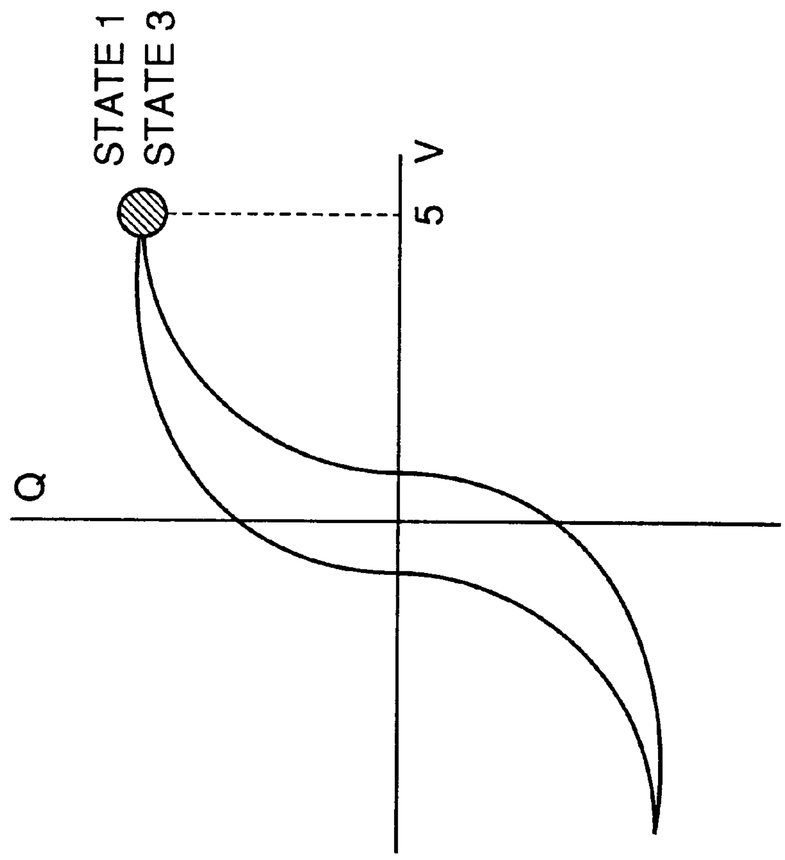
FIG. 41A illustrates polarized states of the conventional ferroelectric memory appearing in FIG. 38 in states 1 and 3 shown in FIG. 39.
Figure 42A:
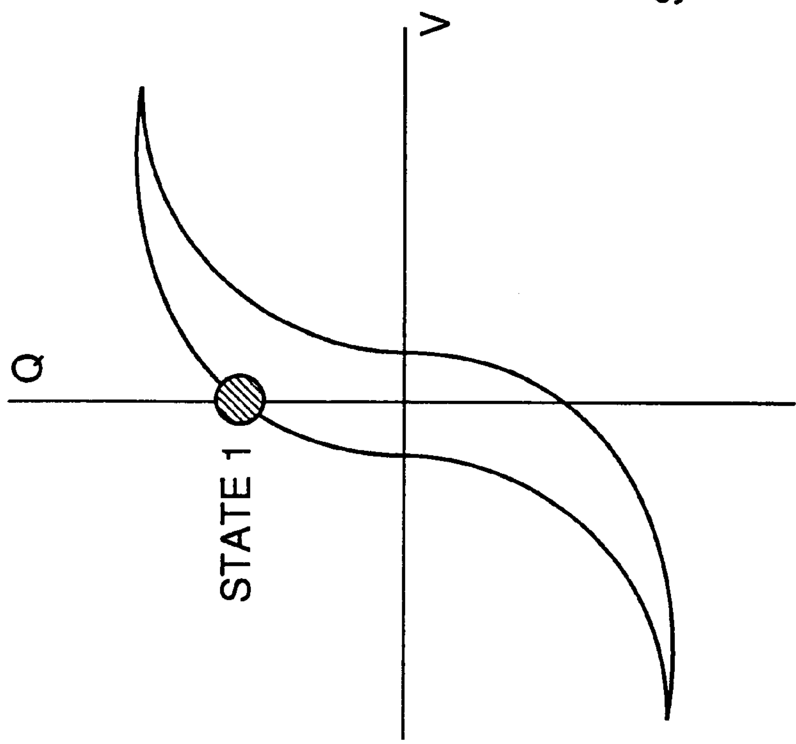
FIG. 42A illustrates a polarized state of the conventional ferroelectric memory appearing in FIG. 38 in a state shown 1 in FIG. 40.
Figure 42B:
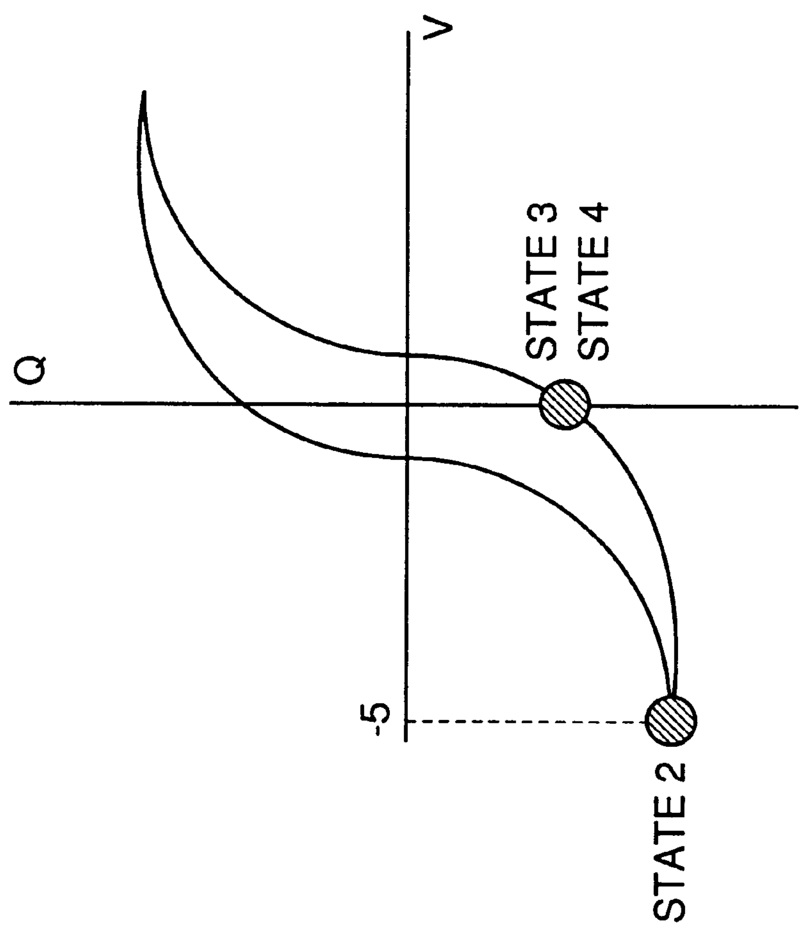
FIG. 42B illustrates polarized states in states 2, 3 and 4 in FIG. 40 respectively.

FIG. 34 is a circuit diagram showing the structure of the oscillator 1350 employed in the embodiment 7 in place of the oscillator 174 described with reference to FIG. 11.

Referring to FIG. 34, the oscillator 1350 includes a NAND circuit 502 receiving a reset signal ZPOR, serially connected invertors 504 to 510 receiving an output of the NAND circuit 502, and an invertor 512 receiving an output of the invertor 510 and outputting a reference clock CLK. The output of the invertor 510 is fed back to an input of the NAND circuit 502.

The oscillator 1350 further includes a potential generation circuit 522 supplying a potential V0 to the invertor 508. The invertor 508 includes a P-channel transistor 536 receiving an input signal IN in its gate and coupling a power supply potential Vcc with an output signal OUT, an N-channel transistor 538 having a gate receiving the input signal IN and a drain coupled to the output signal OUT, and an N-channel transistor 540 receiving the potential V0 in its gate and coupling a ground potential with the source of the N-channel transistor 538.

The potential generation circuit 522 includes an N-channel transistor 534 having a source coupled with the ground potential and a gate and a drain connected with each other, an N-channel transistor 532 having a source coupled to the ground potential and a gate receiving the potential of the drain of the N-channel transistor 534, a P-channel transistor 528 having a source coupled to the power supply potential Vcc and a gate and a drain connected to the drain of the N-channel transistor 532, a P-channel transistor 530 having a gate receiving the potential of the drain of the N-channel transistor 532 and a drain connected with that of the N-channel transistor 534, and a resistance 526 coupling the source of the P-channel transistor 530 with the power supply potential Vcc.

The potential of the drain of the N-channel transistor 534 supplies the potential V0 to the invertor 508. The potential generation circuit 522 and the N-channel transistor 540 included in the invertor 508 form a constant current circuit having small temperature dependence.

While FIG. 34 describes only the invertor 508 with the transistors 536, 538 and 540, the invertors 504, 506 and 510 are similar in structure to the invertor 508, and supplied with the potential V0 from the potential generation circuit 522 to be current-limited respectively.

In the structure shown in FIG. 34, a current source having small temperature dependence supplies a current to the invertors 504 to 510. Thus, the operating speeds of the invertors 504 to 510 have small temperature dependence and the cycle of the reference clock CLK also has small temperature dependence, and hence a prescribed waiting time Tna is hardly influenced by the temperature. This serves to reduce fluctuation of the effect of lower power consumption resulting from the temperature of the semiconductor memory device.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:

a memory cell array having memory cells, each including a ferroelectric capacitor and an access transistor for accessing said ferroelectric capacitor, arranged in the form of a matrix, said memory cell array being split into a plurality of memory blocks;

access detection means for detecting that data of each said memory block is accessed from the exterior;

a plurality of mode set means being provided in correspondence to said plurality of memory blocks respectively, each said mode set means for receiving an output of said access detection means and setting an operation mode of a corresponding memory block at a first mode when a non-accessed period of said corresponding memory block not accessed from the exterior exceeds a prescribed waiting time while setting said operation mode at a second mode when said non-accessed period stays no more than said prescribed waiting time;

refresh means for stopping data refreshment of each said memory block when said operation mode is said first mode while making data refreshment of said memory block when said operation mode is said second mode; and mode switching means for switching an operation mode of each said memory block in such a way that said data written in each of said memory cells is held as a remanent polarization quantity of said ferroelectric capacitor during said first mode while said data is held as potential difference between electrodes of each said ferroelectric capacitor during said second mode, each said mode set means including timer means for measuring said non-accessed period on the basis of a reference clock.

2. The semiconductor memory device in accordance with claim 1, further comprising:

a first power supply terminal receiving a first power supply potential, a second power supply terminal receiving a second power supply potential being higher than said first power supply potential, and down-converting means for receiving said first and second power supply potentials and down-converting said second power supply potential, wherein said memory cell array further includes a plurality of bit lines, each provided corresponding to a column of said memory cell array, and said mode switching means includes:

plate potential control means for setting a cell plate potential of each said ferroelectric capacitor at said first power supply potential when said operation mode is said first mode while setting said cell plate potential at a first intermediate potential which corresponds to an output potential of said down-converting means and has an intermediate value between said first and second power supply potentials when said operation mode is said second mode, recall means, responsive to a change of said operation mode from said first mode to said second mode, for controlling a holding mode converting operation in which a data holding mode changes from holding said data as said remanent polarization quantity of said ferroelectric capacitor into holding said data as said potential difference between said electrodes of said ferroelectric capacitor, and bit line potential control means for setting a precharge potential of said bit line at said first power supply potential in a period of said holding mode converting operation while setting said precharge potential of said bit line at a second intermediate potential which corresponds to said output potential of said down-converting means and has a intermediate value between said first and second power supply potentials when said operation mode is said second mode and each said ferroelectric capacitor is accessed.

3. The semiconductor memory device in accordance with claim 2, wherein said plate potential control means includes:

first switching means for coupling said first intermediate potential with said cell plate of each said ferroelectric capacitor in response to activation of a mode signal corresponding to said operation mode set by said mode set means, and second switching means for coupling said first power supply potential with said cell plate in response to inactivation of said mode signal.

4. The semiconductor memory device in accordance with claim 2, wherein said refresh means includes:

row selector means for successively selecting rows of said memory blocks, refresh control means for controlling said data refreshment, and write means for rewriting data in each said memory cell, and said recall means includes:

oscillation means for generating a reference pulse for said holding mode converting operation, conversion end detection means for counting said reference pulse and detecting an end of said holding mode converting operation when said operation mode is said second mode, and an origin address register holding an address value corresponding to said memory block to perform said holding mode converting operation and outputting said corresponding address value to said row selector means.

5. The semiconductor memory device in accordance with claim 2, wherein said bit line potential control means includes:

first detection means for detecting that said operation mode changes from said first mode to said second mode, second detection means for detecting an end of said holding mode converting operation controlled by said recall means, state hold means for holding a state data being set by said first detection means and reset by said second detection means, and switching means for setting said precharge potential of said bit line at either one of said first power supply potential and second intermediate potential in response to said state data.

6. The semiconductor memory device in accordance with claim 1, further comprising:

a first power supply terminal receiving a first power supply potential, a second power supply terminal receiving a second power supply potential being higher than said first power supply potential, and wherein said mode set means further includes oscillation means for generating said reference clock, and said timer means includes:

count means for counting said reference clock up to said prescribed waiting time after receiving an output of said access detection means, and storage means for holding an operation mode data to be set at second mode in response to said output of said access detection means and to be reset at said first mode in response to an output of said count means and for giving said operation mode data to said refresh means and said mode switching means.

7. The semiconductor memory device in accordance with claim 6, wherein said mode set means further includes power supply potential monitor means for inactivating said oscillation means until an internal power supply potential supplied to said memory blocks reaches a prescribed value.

8. The semiconductor memory device in accordance with claim 6, wherein said oscillation means includes means for stopping generation of said reference clock when said operation mode is said first mode.

9. The semiconductor memory device in accordance with claim 6, wherein said count means includes:

frequency division means for frequency-dividing said reference clock, and frequency division ratio change means for changing the frequency division ratio of said frequency division means.

10. The semiconductor memory device in accordance with claim 6, wherein said count means includes:

transmission means for transmitting an output of said oscillation means, and a plurality of frequency division means for frequency-dividing output of said oscillator means, each of said plurality of frequency division means has connection change means for switching a connection point to be coupled to an input node of a corresponding frequency division means, said connection change means provided in the first one of said plurality of frequency division means couples either an output of said transmission means or a fixed potential to an input node of said first frequency division means, and said connection change means provided in a (i+1)th (i=natural number) one of said plurality of frequency division means couples either said output of said transmission means or an output of i-th said frequency division means to an input node of said (i+1)th frequency division means.

11. The semiconductor memory device in accordance with claim 6, wherein said oscillation means includes a loop having odd stages of logic inversion means for inverting respective input signals, and said loop has connection change means for changing the number of said stages of said logic inversion means included in said loop.

12. The semiconductor memory device in accordance with claim 6, wherein said oscillation means includes:

inversion means for inverting and outputting a signal supplied to an input node with a prescribed delay time, a plurality of delay means, being serially connected, for receiving said output of said inversion means, and a plurality of fuse elements being provided between output nodes of said plurality of delay means and said input node of said inversion means respectively.

13. The semiconductor memory device in accordance with claim 6, wherein said oscillation means includes:

inversion means for inverting and outputting a signal supplied to an input node with a prescribed delay time, a plurality of delay means, being serially connected, for receiving said output of said inversion means, a plurality of transfer gates selectively connecting output nodes of said plurality of delay means to said input node of said inversion means independently of each other, and control means for controlling one of said plurality of transfer gates into a conducting state.

14. The semiconductor memory device in accordance with claim 6, wherein said oscillation means includes a loop having odd stages of logic inversion means for inverting respective input signals, and at least one of said logic inversion means has delay time change means for changing a delay time of a corresponding logic inversion means.

15. The semiconductor memory device in accordance with claim 6, wherein said oscillation means includes a loop having odd stages of logic inversion means, at least one of said logic inversion means includes:

a plurality of P-channel MOS transistors, a plurality of N-channel MOS transistors, first selector means for selectively connecting the drains of said plurality of P-channel MOS transistors to an output node of said one of logic inversion means, and second selector means for selectively connecting the drains of said plurality of N-channel MOS transistors to said output node of said one of logic inversion means, the sources of said plurality of P-channel MOS transistors are coupled to a second power supply potential, and the sources of said plurality of N-channel MOS transistors are coupled to a first power supply potential.

16. The semiconductor memory device in accordance with claim 6, wherein said oscillation means includes a loop having odd stages of logic inversion means for inverting respective input signals, and each said logic inversion means includes constant current supply means for controlling an operation current of said logic inversion means.

* * * * *